United States Patent
Kim

(10) Patent No.: US 11,094,686 B2
(45) Date of Patent: Aug. 17, 2021

(54) INTEGRATED CIRCUIT INCLUDING MULTI-HEIGHT STANDARD CELL AND METHOD OF DESIGNING THE SAME

(71) Applicant: SAMSUNG ELECTRONICS CO., LTD., Suwon-si (KR)

(72) Inventor: Min-Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 16/521,845

(22) Filed: Jul. 25, 2019

(65) Prior Publication Data
US 2020/0243502 A1    Jul. 30, 2020

(30) Foreign Application Priority Data
Jan. 24, 2019   (KR) .................. 10-2019-0009011

(51) Int. Cl.
*H01L 27/00* (2006.01)
*H01L 27/02* (2006.01)
*H01L 27/118* (2006.01)
*G06F 30/392* (2020.01)

(52) U.S. Cl.
CPC ........ *H01L 27/0207* (2013.01); *G06F 30/392* (2020.01); *H01L 27/11807* (2013.01)

(58) Field of Classification Search
None
See application file for complete search history.

(56) References Cited

U.S. PATENT DOCUMENTS

| | | | |
|---|---|---|---|
| 6,800,882 B2 | 10/2004 | Dillon et al. | |
| 8,264,049 B2 | 9/2012 | Becker | |
| 8,723,574 B2 | 5/2014 | Tomita | |
| 9,473,117 B2 | 10/2016 | Kim et al. | |
| 9,537,471 B2 | 1/2017 | Kamal | |
| 9,966,936 B2 | 5/2018 | Kim et al. | |
| 2009/0167394 A1 | 7/2009 | Bosshart | |
| 2014/0246791 A1* | 9/2014 | Stephens | H01L 29/4916 257/786 |
| 2018/0096092 A1* | 4/2018 | Kim | G06F 30/394 |

* cited by examiner

*Primary Examiner* — Reema Patel
(74) *Attorney, Agent, or Firm* — Sughrue Mion, PLLC

(57) ABSTRACT

An integrated circuit includes a semiconductor substrate, first through third power rails, and first through fourth clock gate lines. The first power rail through third power rails are formed above the semiconductor substrate, and extend in a first direction and arranged sequentially in a second direction perpendicular to the first direction. The first through fourth clock gate lines are formed above the semiconductor substrate, and extend in the second direction to pass through a first region between the first power rail and the second power rail and a second region between the second power rail and the third power rail. The first clock gate line and the second clock gate line are arranged to be adjacent to each other in the first direction, and the third clock gate line and the fourth clock gate line are arranged to be adjacent to each other in the first direction.

20 Claims, 29 Drawing Sheets

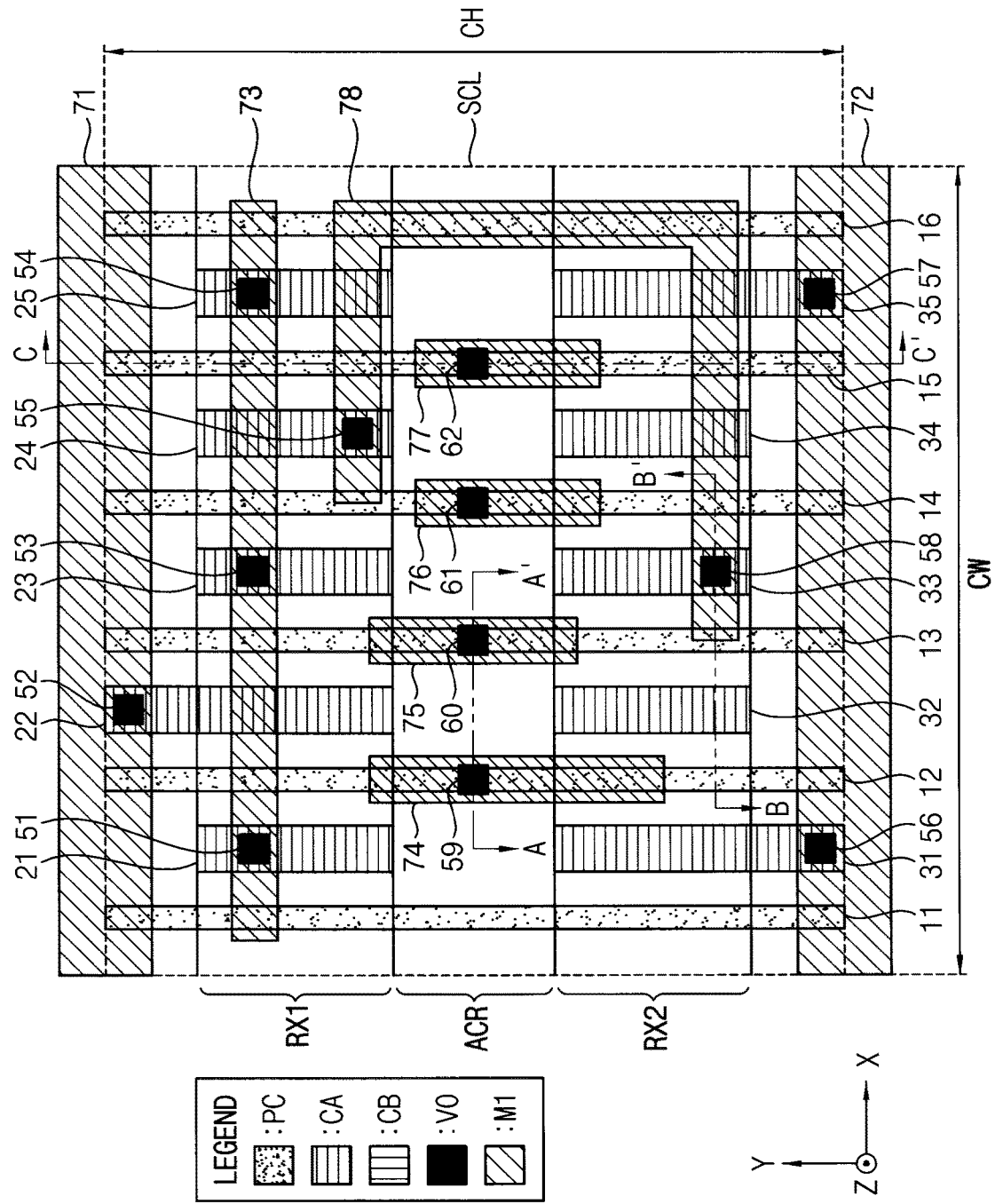

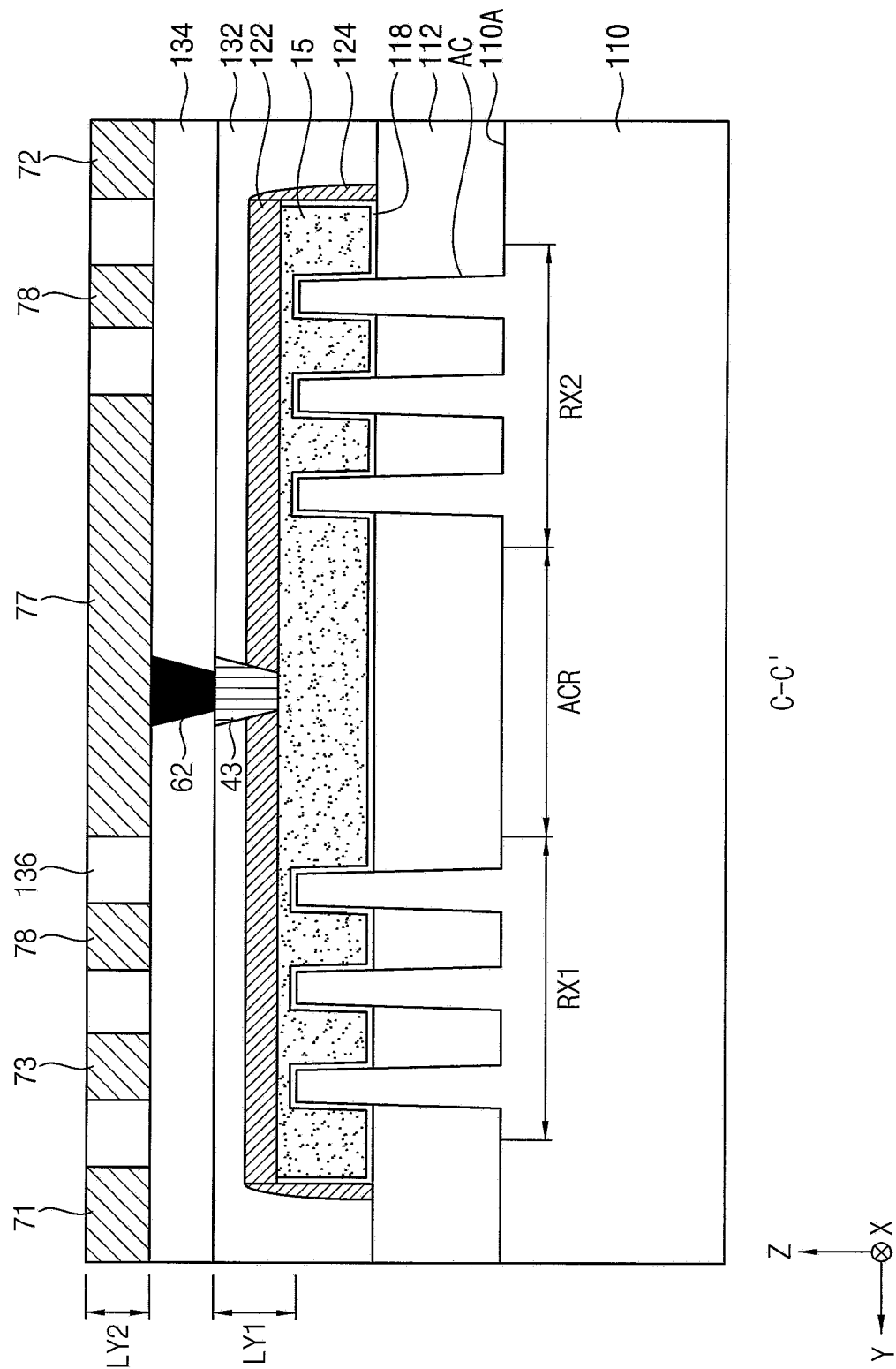

D-D'

E-E'

F-F'

G-G'

209

INTEGRATED CIRCUIT INCLUDING MULTI-HEIGHT STANDARD CELL AND METHOD OF DESIGNING THE SAME

CROSS-REFERENCE TO THE RELATED APPLICATION

This application claims priority from Korean Patent Application No. 10-2019-0009011, filed on Jan. 24, 2019, in the Korean Intellectual Property Office, the disclosure of which is incorporated herein by reference in its entirety.

BACKGROUND

1. Field

Example embodiments relate to semiconductor integrated circuits, and more particularly to an integrated circuit including a multi-height standard cell and a method of designing the integrated circuit.

2. Description of the Related Art

Standard cells having corresponding functions may be used in the design of integrated circuits. The standard cells having predetermined architectures are stored in cell libraries. When designing integrated circuits, the standard cells are retrieved from the cell libraries and placed into desired locations on an integrated circuit layout. Routing is then performed to connect the standard cells with one another and/or with other cells. A standard cell has a predetermined (or set) architecture, e.g., a cell width, a cell height, a cell length, etc. Design efficiency of an integrated circuit may be determined according to configurations and layout of standard cells.

SUMMARY

Some example embodiments may provide an integrated circuit having an efficient clock routing structure and a method of designing the integrated circuit.

According to example embodiments, there is provided an integrated circuit which includes a semiconductor substrate, first through third power rails, and first through fourth clock gate lines. The first power rail through third power rails are formed above the semiconductor substrate, and extend in a first direction and arranged sequentially in a second direction perpendicular to the first direction. The first through fourth clock gate lines are formed above the semiconductor substrate, and extend in the second direction to pass through a first region between the first power rail and the second power rail and a second region between the second power rail and the third power rail. The first clock gate line and the second clock gate line are arranged to be adjacent to each other in the first direction, and the third clock gate line and the fourth clock gate line are arranged to be adjacent to each other in the first direction.

According to example embodiments, there is provided an integrated circuit which includes a semiconductor substrate, a first power rail, a second power rail and a third power rail formed above the semiconductor substrate, extending in a first direction and arranged sequentially in a second direction perpendicular to the first direction, a first flip-flop formed in a first region between the first power rail and the second power rail and including a first master latch and a first slave latch, a second flip-flop formed in a second region between the second power rail and the third power rail and including a second master latch and a second slave latch, and a first clock gate line, a second clock gate line, a third clock gate line and a fourth clock gate line formed above the semiconductor substrate, extending in the second direction to pass through the first region and the second region, the first clock gate line and the second clock gate line arranged to be adjacent to each other in the first direction, and the third clock gate line and the fourth clock gate line arranged to be adjacent to each other in the first direction. The first clock gate line and the second clock gate line provide a clock signal and an inverted clock signal to the first master latch and the second master latch and the third clock gate line and the fourth clock gate line provide the clock signal and the inverted clock signal to the first slave latch and the second slave latch.

According to example embodiments, there is provided a method of designing an integrated circuit which includes receiving input data defining an integrated circuit, providing, in a standard cell library, at least one multi-height standard cell, performing placement and routing based on the input data and the standard cell library and generating output data defining the integrated circuit based on a result of the placement and the routing. The multi-height standard cell includes a semiconductor substrate, a first power rail, a second power rail and a third power rail formed above the semiconductor substrate, extending in a first direction and arranged sequentially in a second direction perpendicular to the first direction, and a first clock gate line, a second clock gate line, a third clock gate line and a fourth clock gate line formed above the semiconductor substrate, extending in the second direction to pass through a first region between the first power rail and the second power rail and a second region between the second power rail and the third power rail, the first clock gate line and the second clock gate line arranged to be adjacent to each other in the first direction, and the third clock gate line and the fourth clock gate line arranged to be adjacent to each other in the first direction.

The integrated circuit and the method of designing the integrated circuit according to example embodiments may reduce an occupation area of the integrated circuit and enhance performance of the integrated circuit using the multi-height standard cell having an efficient clock routing structure to reduce wirings for connecting clock nodes and an efficient arrangement of transistors according to the clock routing structure.

BRIEF DESCRIPTION OF THE DRAWINGS

Example embodiments of the inventive concept will be more clearly understood from the following detailed description taken in conjunction with the accompanying drawings.

FIG. 3 is a diagram illustrating a layout of an example standard cell.

FIGS. 4A, 4B and 4C are cross-sectional views of a standard cell that may have the same layout as the standard cell of FIG. 3.

DETAILED DESCRIPTION OF THE EXAMPLE EMBODIMENTS

Figure 1:
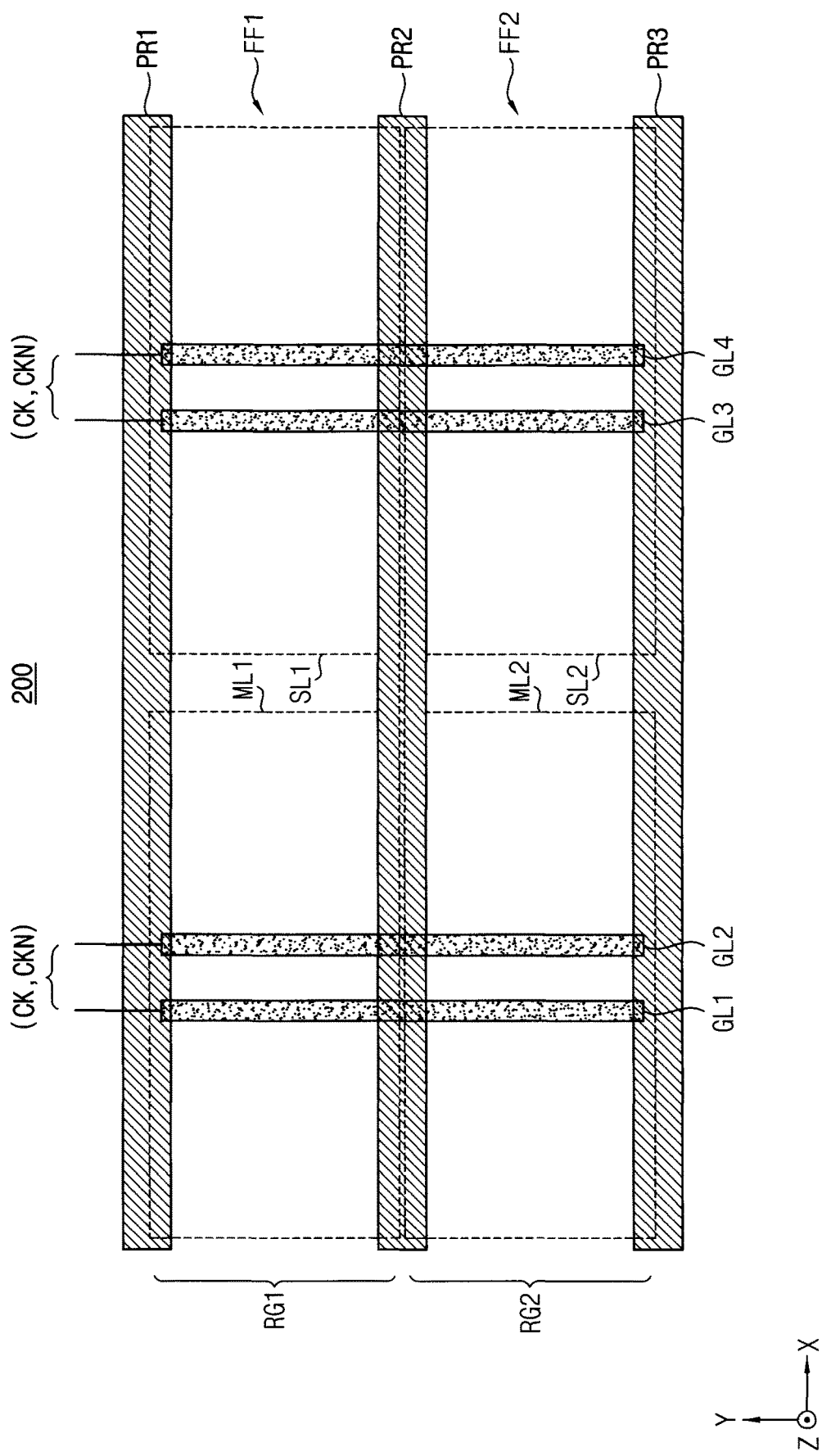
FIG. 1 is a diagram illustrating a layout of an integrated circuit having a clock routing structure according to example embodiments.

Various example embodiments will be described more fully hereinafter with reference to the accompanying drawings. In the drawings, like numerals refer to like elements throughout. The repeated descriptions may be omitted.

Hereinafter, structures of an integrated circuit according to example embodiments are described using a first direction X, a second direction Y, and a third direction Z in a three-dimensional space. The first direction X may be a row direction, the second direction Y may be a column direction, and the third direction Z may be a vertical direction. The first direction X, the second direction Y, and the third direction Z may intersect, e.g., may be orthogonal or perpendicular to one another.

FIG. 1 is a diagram illustrating a layout of an integrated circuit having a clock routing structure according to example embodiments.

Referring to FIG. 1, an integrated circuit 200 may include a first power rail PR1, a second power rail PR2, a third power rail PR3, a first clock gate line GL1, a second clock gate line GL2, a third clock gate line GL3, and a fourth clock gate line GL4.

The first power rail PR1, the second power rail PR2, and the third power rail PR3 are formed above a semiconductor substrate and extend in the first direction X. The first power rail PR1, the second power rail PR2, and the third power rail PR3 are spaced apart from one another and arranged sequentially in the second direction Y.

The first clock gate line GL1, the second clock gate line GL2, the third clock gate line GL3 and the fourth clock gate line GL4 are formed above the semiconductor substrate and extend in the second direction Y to pass through a first region RG1 between the first power rail PR1 and the second power rail PR2 and a second region RG2 between the second power rail PR2 and the third power rail PR3. The first clock gate line GL1 and the second clock gate line GL2 are arranged to be adjacent to each other in the first direction X, and the third clock gate line GL3 and the fourth clock gate line GL4 are arranged to be adjacent to each other in the first direction Y. In this disclosure, the term "adjacent" represents that another gate line is not inserted between two adjacent gate lines.

One of the first clock gate line GL1 and the second clock gate line GL2 forms a first clock node to which a clock signal CK is applied, and the other of the first clock gate line GL1 and the second clock gate line GL2 forms a first inversion clock node to which an inverted clock signal CKN, which is an inversion signal of the clock signal CK, is applied. In addition, one of the third clock gate line GL3 and the fourth clock gate line GL4 forms a second clock node to which the clock signal CK is applied, and the other of the third clock gate line GL3 and the fourth clock gate line GL4 forms a second inversion clock node to which the inverted clock signal CKN is applied.

In some example embodiments, the integrated circuit 200 may be a multi-bit flip-flop circuit. In this case, a first flip-flop FF1 including a first master latch ML1 and a first slave latch SL1 may be formed in the first region RG1 and a second flip-flop FF2 including a second master latch ML2 and a second slave latch SL2 may be formed in the second region RG2. The first clock gate line GL1 and the second clock gate line GL2 may provide the clock signal CK and the inverted clock signal CKN to the first master latch ML1 and the second master latch ML2, and the third clock gate line GL3 and the fourth clock gate line GL4 may provide the clock signal CK and the inverted clock signal CKN to the first slave latch SL1 and the second slave latch SL2.

FIG. 1 illustrates a double-height standard cell having the first through fourth clock gate lines GL1-GL4 extended to pass through the two adjacent regions RG1 and RG2 defined by the three power rails PR1, PR2, and PR3. However, example embodiments may be applied to a layout of a multi-height standard cell in which the first through fourth clock gate lines GL1-GL4 pass through three or more adjacent regions defined by four or more power rails.

An occupation area of an integrated circuit may be reduced and performance of the integrated circuit may be enhanced using the multi-height standard cell having an efficient clock routing structure.

Figure 2A:
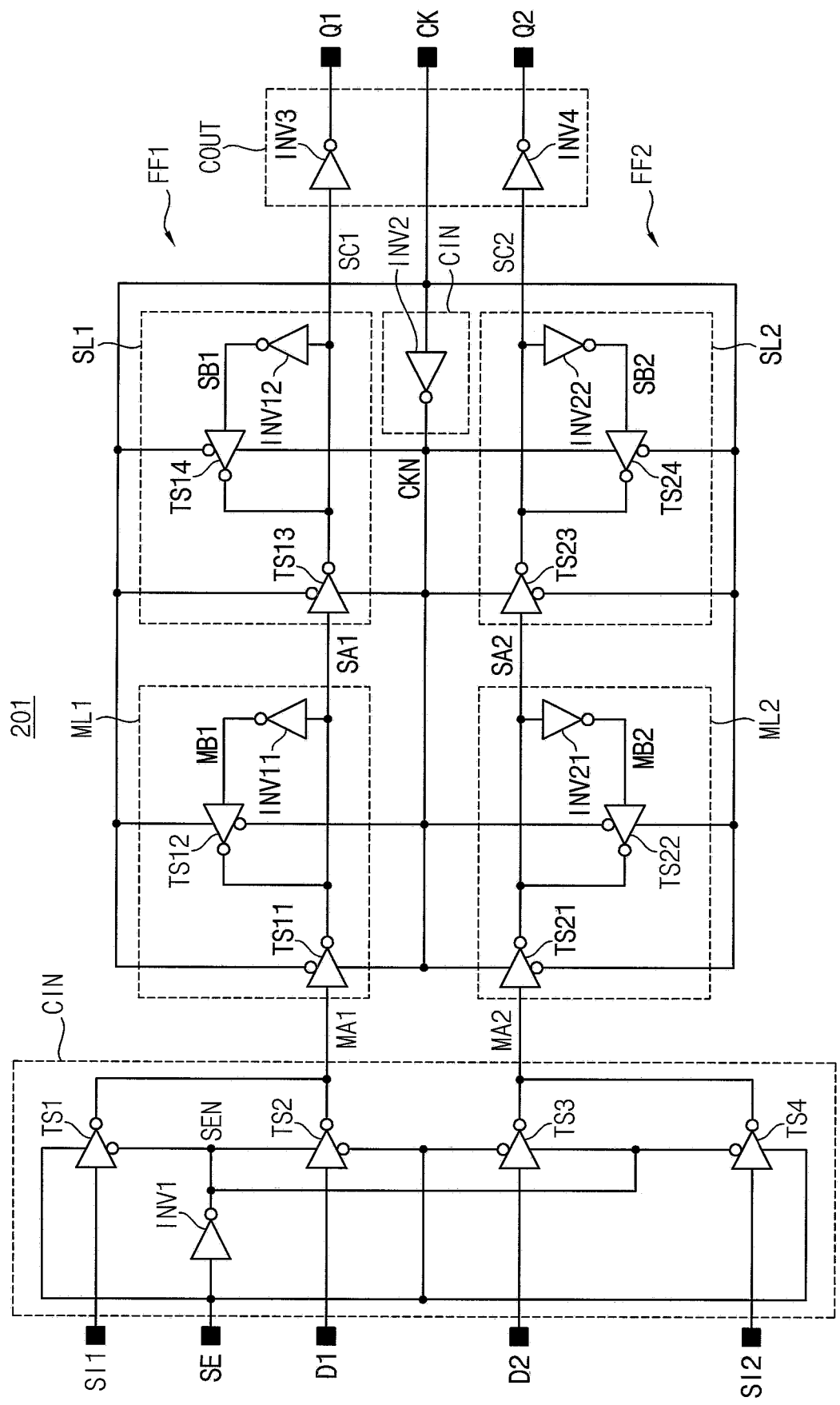
FIGS. 2A and 2B are diagrams illustrating example embodiments of an integrated circuit applicable to the layout of FIG. 1.
Figure 2B:
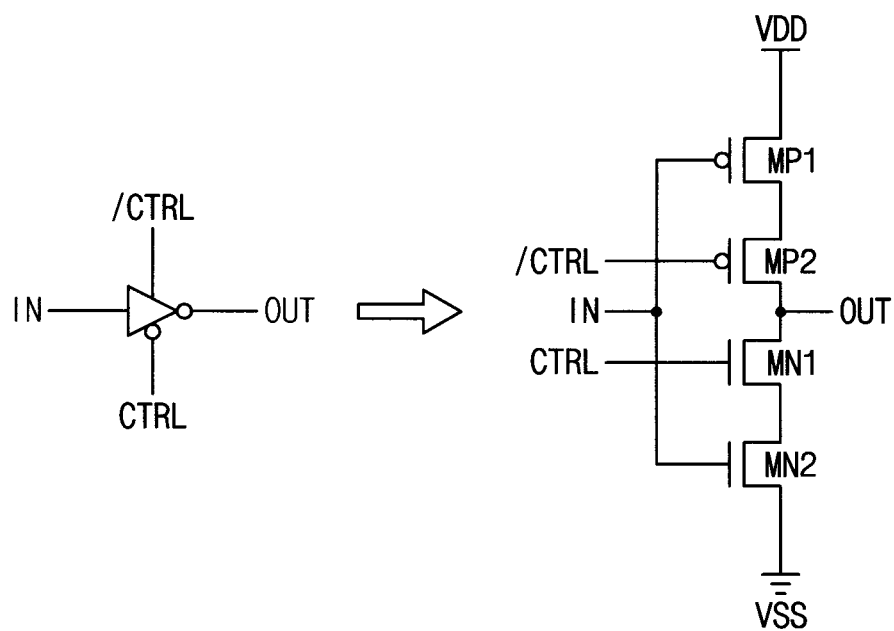

FIGS. 2A and 2B are diagrams illustrating example embodiments of an integrated circuit applicable to the layout of FIG. 1.

Referring to FIG. 2A, an integrated circuit 201 may include a first flip-flop FF1 and a second flip-flop FF2. In some example embodiments, the integrated circuit 201 may further include an input circuit CIN and an output circuit COUT.

The first flip-flop FF1 may include a first master latch ML1 and a first slave latch SL2, and the second flip-flop FF2 may include a second master latch ML2 and a second slave latch SL2. The first master latch ML1 may latch a first input signal MA1 in synchronization with the clock signal CK and an inverted clock signal CKN to generate a first master output signal SA1. The first slave latch SL1 may latch the first master output signal SA1 in synchronization with the clock signal CK and the inverted clock signal CKN to generate a first slave output signal SC1. The second master latch ML2 may latch a second input signal MA2 in synchronization with the clock signal CK and the inverted clock signal CKN to generate a second master output signal SA2. The second slave latch SL2 may latch the second master output signal SA2 in synchronization with the clock signal CK and the inverted clock signal CKN to generate a second slave output signal SC2.

The first master latch ML1 may include a first tri-state inverter TS11, a second tri-state inverter TS12 and an inverter INV11, and the first slave latch SL1 may include a third tri-state inverter TS13, a fourth tri-state inverter TS14 and an inverter INV12. The second master latch ML2 may include a fifth tri-state inverter TS21, a sixth tri-state inverter TS22 and an inverter INV21, and the second slave latch SL2 may include a seventh tri-state inverter TS23, an eighth tri-state inverter TS24 and an inverter INV22.

The first through eighth tri-state inverters TS11-TS14 and TS21-TS24 operate in synchronization with the clock signal CK and the inverted clock signal CKN. An input node of the first tri-state inverter TS11 corresponds to a node of the first input signal MA1 and an output node of the first tri-state inverter TS11 corresponds to a node of the first master output signal SA1. In other words, the first tri-state inverter TS11 receives the first input signal MA1 and outputs the first master output signal SA1. The second tri-state inverter TS12 receives a first inverted master output signal MB1 and outputs the first master output signal SA1. The third tri-state inverter TS13 receives the first master output signal SA1 and outputs the first slave output signal SC1. The fourth tri-state inverter TS14 receives a first inverted slave output signal SB1 and outputs the first slave output signal SC1. The fifth tri-state inverter TS21 receives the second input signal MA2 and outputs the second master output signal SA2. The sixth tri-state inverter TS22 receives a second inverted master output signal MB2 and outputs the second master output signal SA2. The seventh tri-state inverter TS23 receives the second master output signal SA2 and outputs the second slave output signal SC2. The eighth tri-state inverter TS24 receives a second inverted slave output signal SB2 and outputs the second slave output signal SC2.

The input circuit CIN may include inverters INV1 and INV2 and tri-state inverters TS1-TS4. The input circuit CIN may operate in synchronization with a scan enable signal SE and an inverted scan enable signal SEN to provide one of a first scan input signal SI1 and a first data signal D1 as the first input signal MA1 and provide one of a second scan input signal SI2 and a second data signal D2 as the second input signal MA2. In addition, the input circuit CIN may provide the clock signal CK and the inverted clock signal CKN. The output circuit COUT may include inverters INV3 and INV4 to buffer the first slave output signal SC1 and the second slave output signal SC2, and output final output signals Q1 and Q2.

The integrated circuit 201 of FIG. 2A corresponds to an example of a two-bit flip-flop circuit of a master-slave type. The clock routing structure and the transistor arrangement based on the clock routing structure are not limited to the configuration of FIG. 2A, and may be applicable to various integrated circuits.

FIG. 2B illustrates an example of a tri-state inverter.

Referring to FIG. 2B, the tri-state inverter may include a first input transistor MP1, a first clock transistor MP2, a second clock transistor MN1 and a second input transistor MN2, which are connected in series between a power supply voltage VDD and a ground voltage VSS.

The first clock transistor MP2 may pull up an output node generating an output signal OUT in response to an inverted control signal /CTRL, and the second clock transistor MN1 may pull down the output node in response to a control signal CTRL. The first input transistor MP1 may electrically connect the first clock transistor MP2 to the power supply voltage VDD in response to an input signal IN, and the second input transistor MN2 may electrically connect the second clock transistor MN1 to the ground voltage VSS in response to the input signal IN.

Hereinafter, an example structure of a standard cell is described with reference to FIGS. 3 and 4A-4C, which may support understanding of a layout of an integrated circuit according to example embodiments.

Figure 4A:
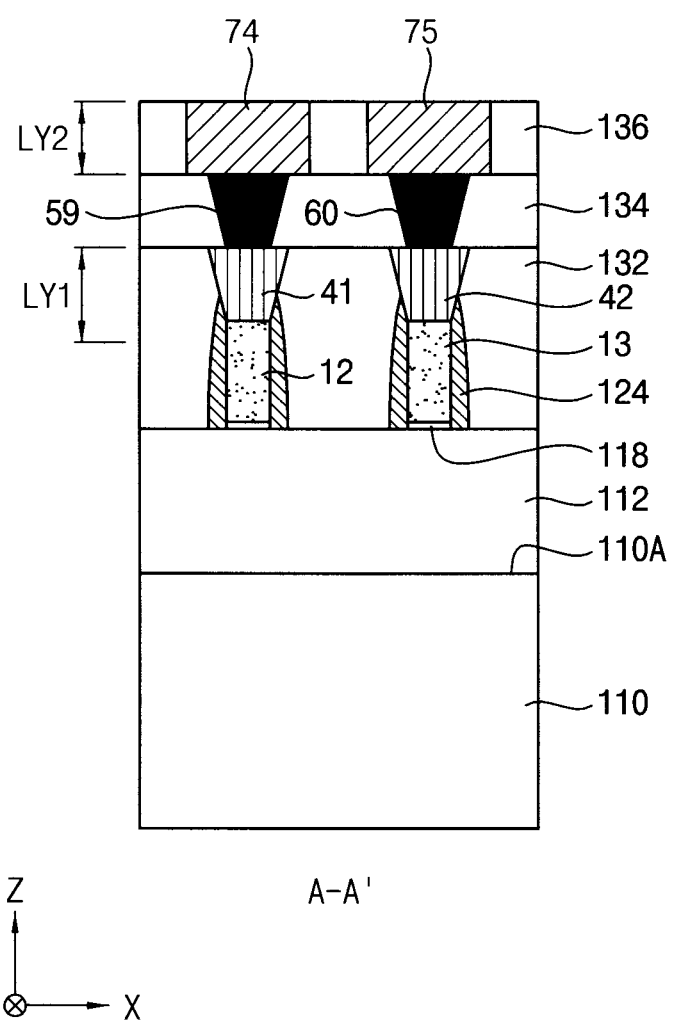
Figure 4B:
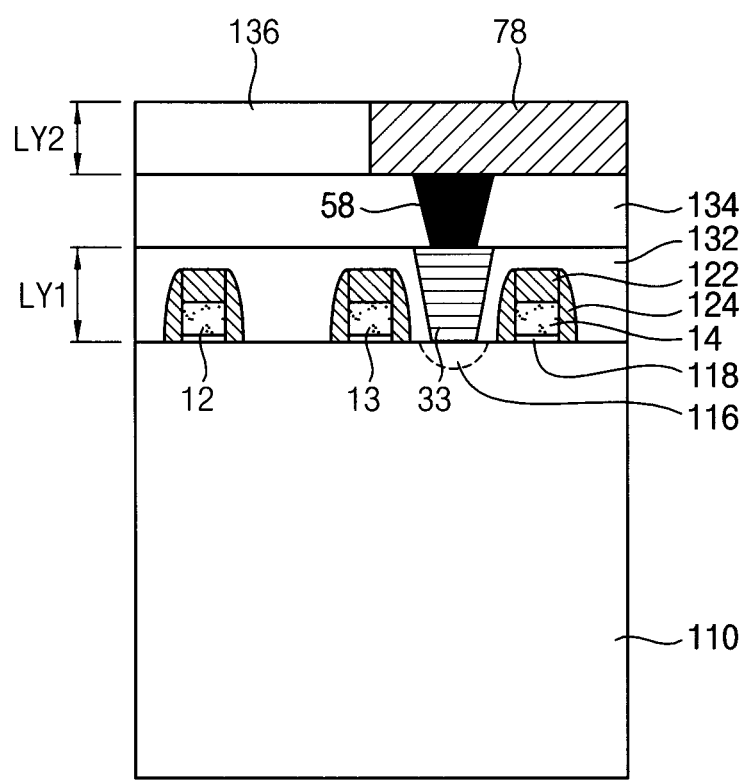

FIG. 3 is a diagram illustrating a layout of an example standard cell, and FIGS. 4A, 4B and 4C are cross-sectional views of a standard cell that may have the same layout as the standard cell of FIG. 3.

FIGS. 4A-4C illustrate a portion of a standard cell SCL that includes a fin field effect transistor (FinFET). FIG. 4A is a cross-sectional view of the standard cell SCL of FIG. 3 along a line A-A'. FIG. 4B is a cross-sectional view of the standard cell SCL of FIG. 3 along a line B-B'. FIG. 4C is a cross-sectional view of the standard cell SCL of FIG. 3 along a line C-C'.

Referring to FIGS. 3 and 4A-4C, the standard cell SCL may be formed on a substrate 110 having an upper surface 110A that extends in a horizontal direction, e.g., the first direction X and the second direction Y. The standard cell SCL may include a first device area RX1, a second device area RX2, and an active cut area ACR therebetween separating the first and second device areas RX1 and RX2 along the second direction Y. Each of the first and second device areas RX1 and RX2 may include a plurality of fin-type active areas AC protruding along the third direction Z from the substrate 110, as shown in FIG. 4C. In some example embodiments, the fin structure may be omitted in case of bulk metal oxide semiconductor (MOS) processes. The active areas AC may extend in parallel to one another in the first direction X. A device isolation layer 112 may be formed between the active areas AC on the substrate 110 along the second direction Y. The active areas AC protrude from the device isolation layer 112 along the third direction Z in the form of fins.

A plurality of gate insulation layers 118 and a plurality of gate lines PC 11-16 may be formed on the substrate 110. The gate lines PC 11-16 may extend in the direction Y crossing the active areas AC. The gate insulation layers 118 and the gate lines PC 11-16 may cover an upper surface and sidewalls of each of the active areas AC and an upper surface of the device isolation layer 112.

A plurality of MOS transistors may be formed along the gate lines PC 11-16. The MOS transistors may have a three-dimensional structure in which channels are formed in the upper surface and the two sidewalls of the active areas AC.

The gate insulation layers 118 may be formed of a silicon oxide layer, a high-k dielectric layer, or a combination thereof. The gate insulation layers 118 may be formed, e.g., by using an atomic layer deposition (ALD) method, a chemical vapor deposition (CVD) method, a physical vapor deposition (PVD) method, or the like.

The gate lines PC 11-16 may extend on the gate insulation layers 118 across the active areas AC while covering the upper surface and the two sidewalls of each of the active areas AC. A mask 122 may be formed on each of the gate lines PC. Side walls of the insulation layer 118, the gate lines PC 11-16, and the mask 122 may be covered by a spacer 124. In some example embodiments, the gate mask 122 may be omitted, and the gate mask 122 may be removed at a portion of at least one of the gate lines PC 11-16 forming a conductive contact for an upper structure.

The gate lines PC 11-16 may have a structure in which a metal nitride layer, a metal layer, a conductive capping layer, and a gap-fill metal layer are sequentially stacked.

A plurality of conductive contacts CA and CB may be formed in a first layer LY1 on the active areas AC. The conductive contacts CA and CB include a plurality of first contacts CA 21-25, and 31-35 connected to a source/drain area 116 of the active areas AC as shown in FIG. 4B, and a plurality of second contacts CB 41-43 connected to the gate lines PC 11-16 as shown in FIGS. 4A and 4C).

The conductive contacts CA and CB may be insulated from one another by a first interlayer insulation layer 132 that covers the active areas AC and the gate lines PC 11-16. The conductive contacts CA and CB may have an upper surface that is at substantially the same level as an upper surface of the first interlayer insulation layer 132. The first interlayer insulation layer 132 may be a silicon oxide layer.

A second interlayer insulation layer 134 and a plurality of lower via contacts V0 51-62 that pass through the second interlayer insulation layer 134 are formed on the first interlayer insulation layer 132. The second interlayer insulation layer 134 may be a silicon oxide layer.

A plurality of wirings M1 71-78 extending in the first direction X or in the second direction Y in a second layer LY2, which is higher than the first layer LY1, e.g., further from the substrate 110 along the third direction Z, may be formed on the second interlayer insulation layer 134. Each of the wirings M1 71-78 may be connected to one of the conductive contacts CA and CB through one of the lower via contacts V0 51-62 formed between the first layer LY1 and the second layer LY2. Each of the lower via contacts V0 51-62 may be connected to one of the conductive contacts CA and CB, e.g., by passing through the second interlayer insulation layer 134. The lower via contacts V0 51-62 may be insulated from one another by the second interlayer insulation layer 134. The wirings M1 71-78 may include an internal connection wiring that electrically connects a plurality of areas in the standard cell SCL. For example, the internal connection wiring 78 may electrically connect the active area AC in the first device area RX1 and the active area AC in the second device area RX2 through the lower via contacts 55 and 58 and the first contacts CA 24 and 33.

The wirings M1 71 and 72 may correspond to the first power rail PR1 and the second power rail PR2, respectively. The first power rail 71 may be connected to the active area AC in the first device area RX1. The second power rail 72 may be connected to the active area AC in the second device area RX2. One of the first and second power rails 71 and 72 may be a wiring for supplying a power supply voltage (e.g., the first power supply voltage VDD) and the other of the first and second power rails 71 and 72 may be a wiring for supplying a ground voltage (e.g., the second power supply voltage VSS). The first power rail 71 and the second power rail 72 may extend in the first direction X parallel to each other in the second layer LY2. In some example embodiments, the power rails 71 and 72 may be formed at substantially the same time with the other wirings M1 73-78. The wirings M1 71-78 may pass through a third interlayer insulation layer 136. The third interlayer insulation layer 136 may insulate the wirings M1 71-78 from one another.

A cell height CH of the standard cell SCL may be defined by the distance along the second direction Y between the first power rail 71 and the second power rail 72. A cell width CW of the standard cell SCL may be defined along the first direction X that is parallel to the power rails 71 and 72.

The pitch of the wirings M1 71-78 may have to meet limitations due to a minimum spacing rule. For example, the wirings M1 71-78 may have to meet limitations according to a "tip-to-side" restriction and a "corner rounding" restriction. The size, disposition, and spacing of the wirings M1 71-78 may be limited by such restrictions.

The integrated circuit according to some example embodiments may correspond to a combination of various standard cells.

Hereinafter, the same reference marks or numerals may be used to indicate a signal and a node of the signal. For example, "CK" may be used to indicate a clock signal or a node to which the clock signal is applied.

Figure 5:
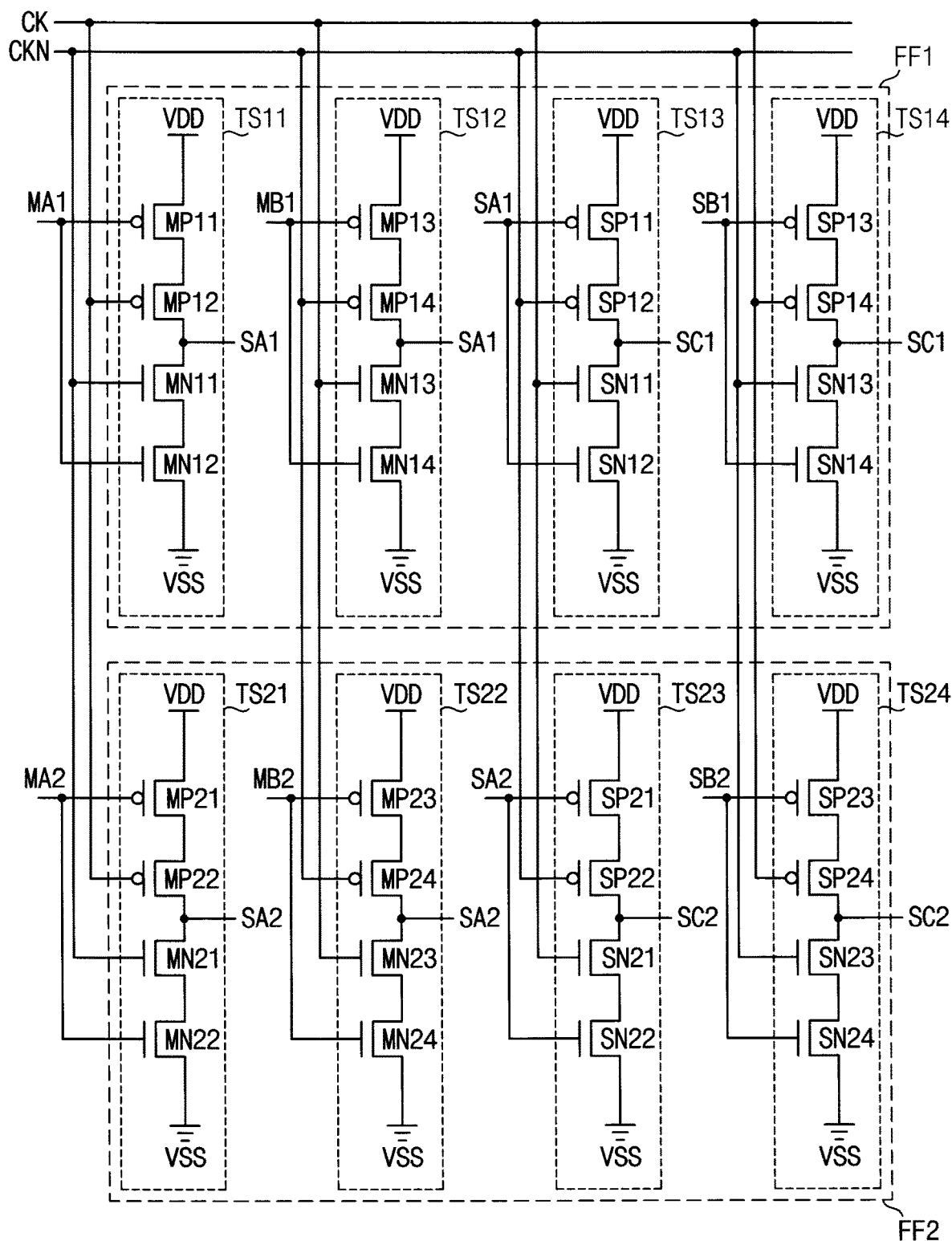
FIG. 5 is a circuit diagram illustrating an integrated circuit according to example embodiments.

FIG. 5 is a circuit diagram illustrating an integrated circuit according to example embodiments.

Referring to FIG. 5, an integrated circuit 202 may include a first flip-flop FF1 and a second flip-flop FF2. The first flip-flop FF1 may include first through fourth tri-state inverters TS11-TS14 operating in synchronization with a clock signal CK and an inverted clock signal CKN, and the second flip-flop FF2 may include fifth through eighth tri-state inverters TS21-TS24 operating also in synchronization with the clock signal CK and the inverted clock signal CKN. Hereinafter, the descriptions repeated with FIGS. 2A and 2B may be omitted.

The first tri-state inverter TS11 may include a first clock transistor MP12 pulling up a node generating a first master output signal SA1 (that is, a node SA1) in response to the clock signal CK and a second clock transistor MN11 pulling down the node SA1 in response to the inverted clock signal CKN. The second tri-state inverter TS12 may include a third clock transistor MP14 pulling up a node generating the first master output signal SA1 (that is, the node SA1) in response to the inverted clock signal CKN and a fourth clock transistor MN13 pulling down the node SA1 in response to the clock signal CK. The third tri-state inverter TS13 may include a fifth clock transistor SP12 pulling up a node SC1 in response to the inverted clock signal CKN and a sixth clock transistor SN11 pulling down the node SC1 in response to the clock signal CK. The fourth tri-state inverter TS14 may include a seventh clock transistor SP14 pulling up the node SC1 in response to the clock signal CK and an eighth clock transistor SN13 pulling down the node SC1 in response to the inverted clock signal CKN. The fifth tri-state inverter TS21 may include a ninth clock transistor MP22 pulling up a node generating a second master output signal SA2 (that is, a node SA2) in response to the clock signal CK and a tenth clock transistor MN21 pulling down the node SA2 in response to the inverted clock signal CKN. The sixth tri-state inverter TS22 may include an eleventh clock transistor MP24 pulling up the node SA2 in response to the inverted clock signal CKN and a twelfth clock transistor MN23 pulling down the node SA2 in response to the clock signal CK. The seventh tri-state inverter TS23 may include a thirteenth clock transistor SP22 pulling up a node generating a second slave output signal SC2 (that is, a node SC2) in response to the inverted clock signal CKN and a fourteenth clock transistor SN21 pulling down the node SC2 in response to the clock signal CK. The eighth tri-state inverter TS24 may include a fifteenth clock transistor SP24 pulling up the node SC2 in response to the clock signal CK and a sixteenth clock transistor SN23 pulling down the node SC2 in response to the inverted clock signal CKN.

As described above, each of the input P-type metal oxide semiconductor (PMOS) transistors MP11, MP13, SP11, SP13, MP21, MP23, SP21 and SP23 and the input N-type metal oxide semiconductor (NMOS) transistors MN12, MN14, SN12, SN14, MN22, MN24, SP22 and SP24 may connect a corresponding clock transistor to one of the power supply voltage VDD and the ground voltage VSS in response to corresponding one of received signals MA1, MB1, SA1, SB1, MA2, MB2, SA2 and SB2.

Figure 6:
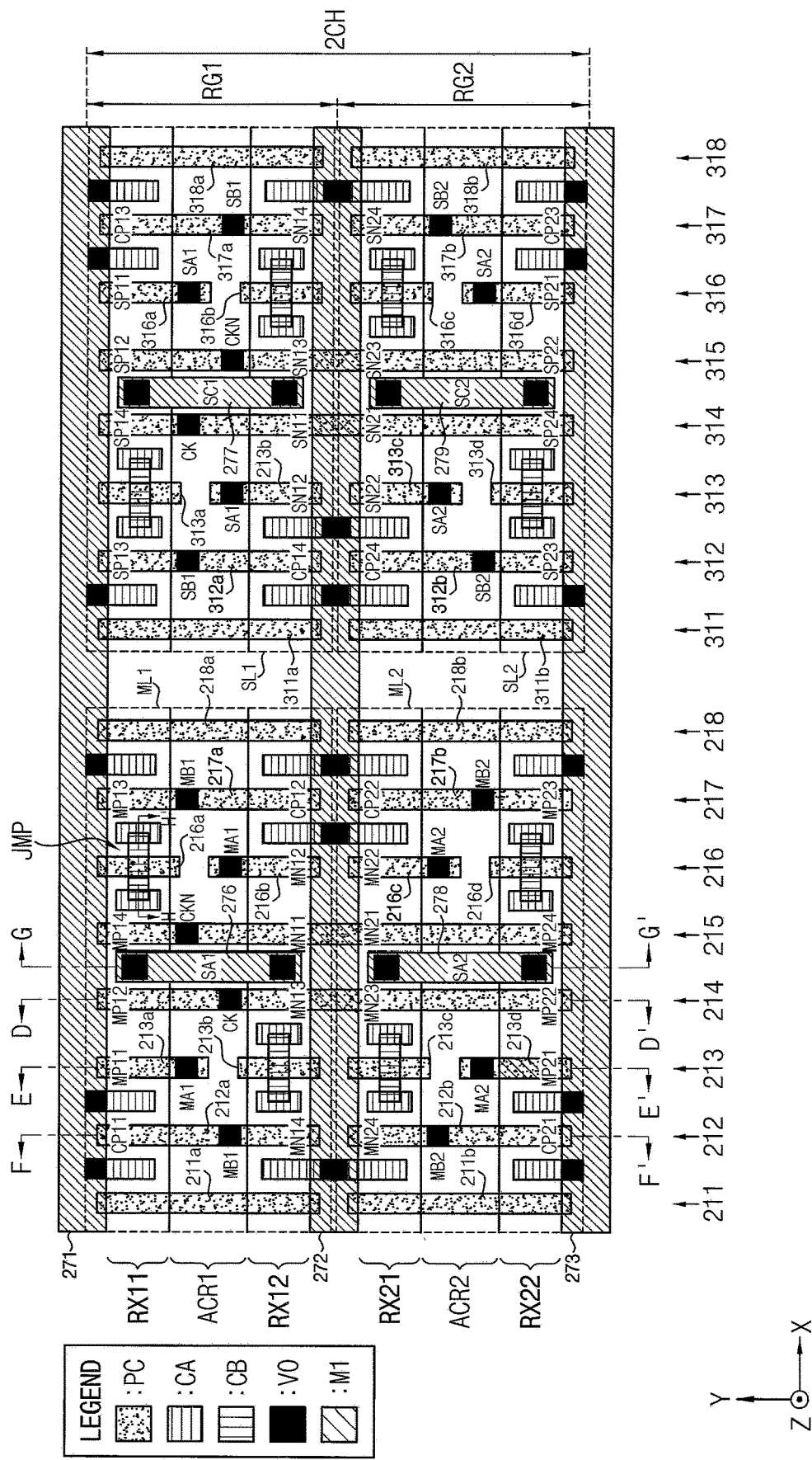
FIG. 6 is a diagram illustrating an example embodiment of a layout of a standard cell corresponding to the integrated circuit of FIG. 5.
Figure 7A:
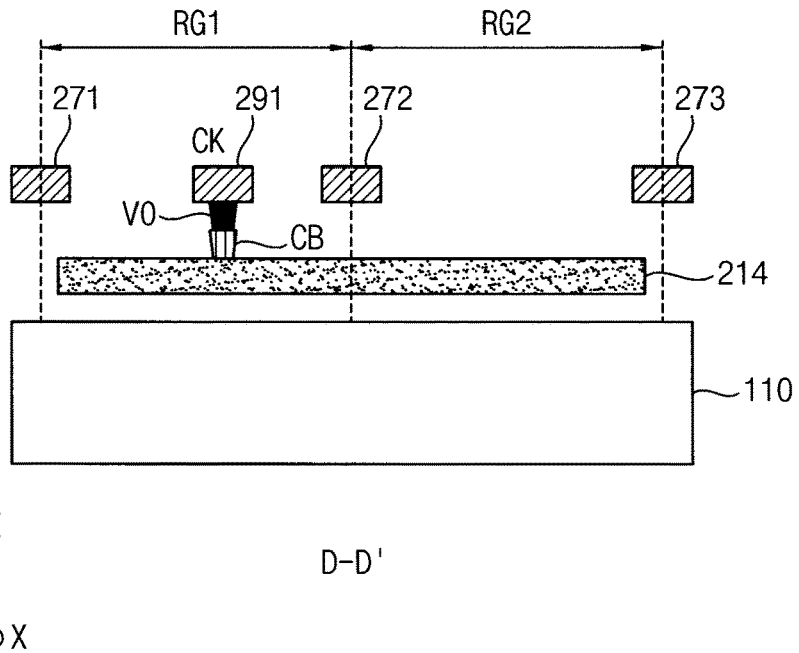
FIGS. 7A, 7B, 7C, 7D and 7E are cross-sectional views of a standard cell that may have the same layout as the standard cell of FIG. 6 according to example embodiments.
Figure 7B:
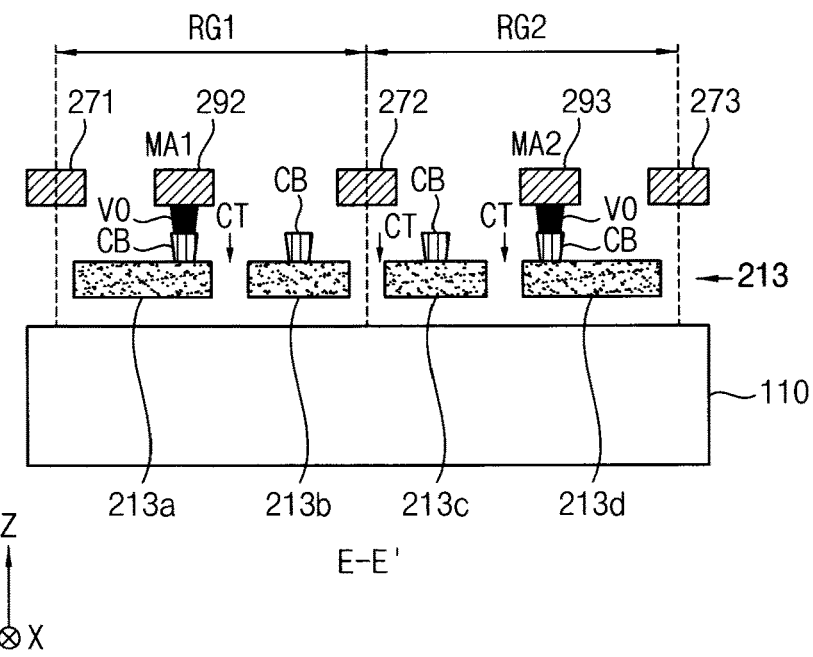
Figure 7C:
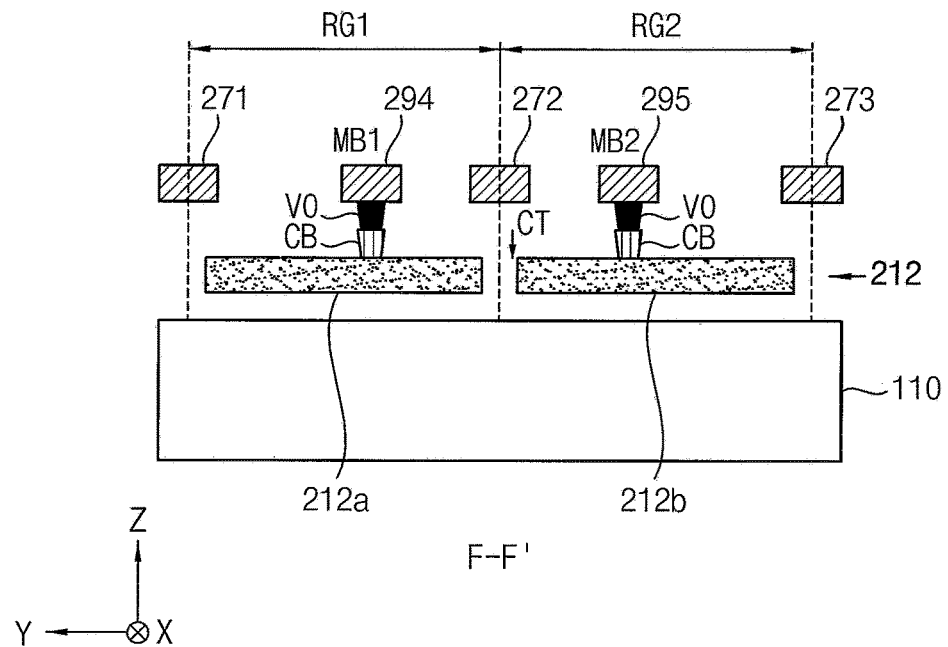
Figure 7D:
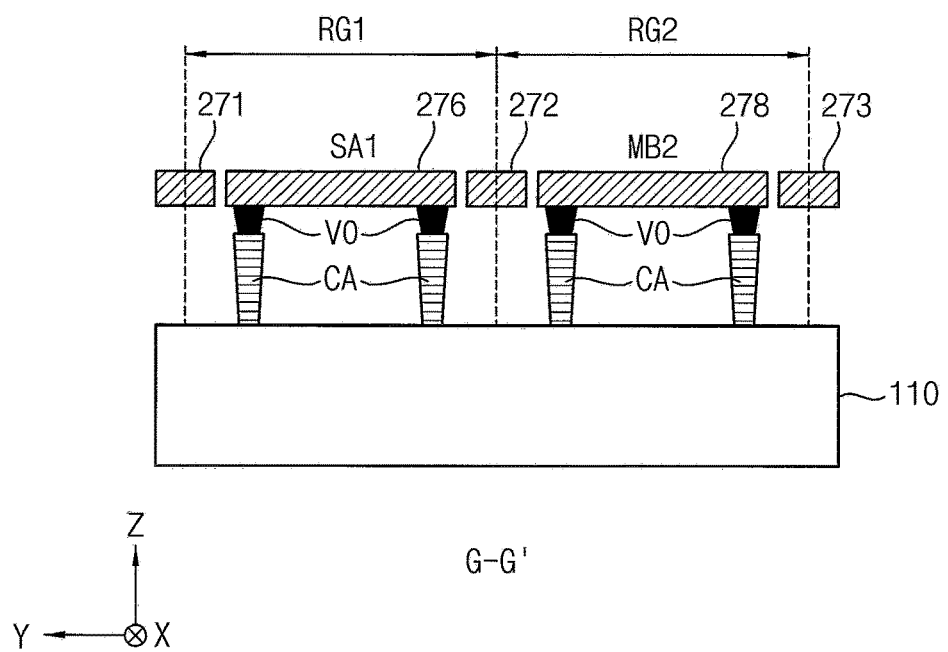
Figure 7E:
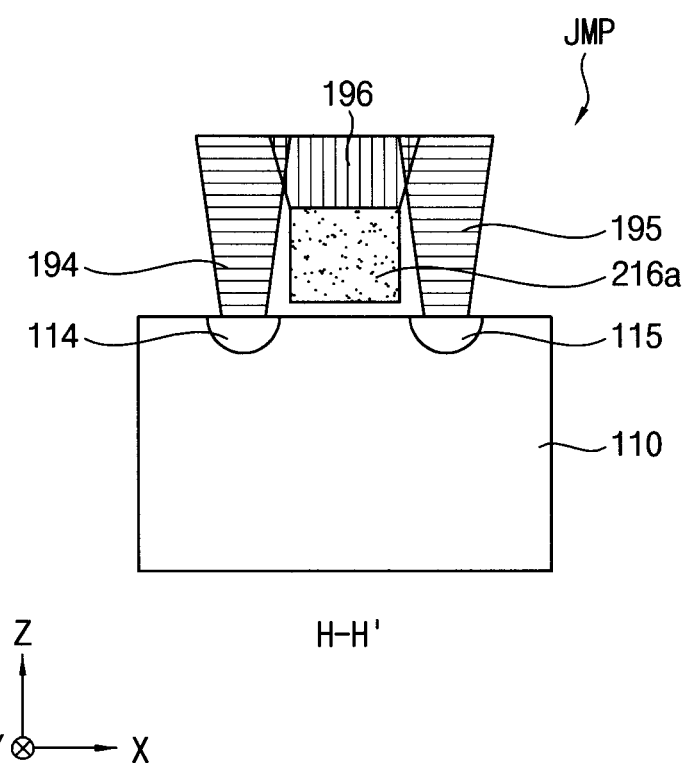

FIG. 6 is a diagram illustrating an example embodiment of a layout of a standard cell corresponding to the integrated circuit of FIG. 5, and FIGS. 7A-7E are cross-sectional views of a standard cell that may have the same layout as the standard cell of FIG. 6 according to example embodiments. FIG. 7A is a cross-sectional view of the standard cell SCL of FIG. 6 along a line D-D'. FIG. 7B is a cross-sectional view of the standard cell SCL of FIG. 6 along a line E-E'. FIG. 7C is a cross-sectional view of the standard cell SCL of FIG. 6 along a line F-F'. FIG. 7D is a cross-sectional view of the standard cell SCL of FIG. 6 along a line G-G'. FIG. 7E is a cross-sectional view of the standard cell SCL of FIG. 6 along a line H-H'. The descriptions repeated with FIGS. 3, 4A, 4B and 4C may be omitted.

FIG. 6 illustrates the transistors included in the first through fourth tri-state inverters TS11-TS14 of the first master latch ML1 and the first slave latch SL1, and the transistors included in the fifth through eighth tri-state inverters TS21-TS24 of the second master latch ML2 and the second slave latch SL2. Other elements in the integrated circuit may be disposed properly between and/or sides of the master latches and the slave latches.

Referring to FIGS. 6 and 7A-7E, a standard cell in a semiconductor substrate may include a first power rail 271, a second power rail 272, a third power rail 273, a plurality of gate lines 211-218 and 311-318, and column connection wirings 276-279 in a first metal layer M1, a row connection wiring 291, and a column connection wiring 292 in a second metal layer M2 (not shown). The gate lines 211-218 and 311-318 include first through fourth clock gate lines 214, 215, 314 and 315 to be described later.

In FIG. 6, the nodes of the same reference marks may be electrically connected to one another through upper wirings (not shown). The conductive contacts CA and CB and the wirings in the first metal layer M1 may be connected through lower via contacts V0, and the wirings in the first metal layer M1 and the wirings in the second metal layer M2 (not shown) may be connected through upper via contacts (not shown). The first metal layer M1 may be the lowest metal layer or have at least one metal layer under the first metal layer M1. The power rails 271, 272 and 273 may be formed in the first metal layer M1 as illustrated in FIGS. 6 and 7A-7E, but example embodiments are not limited thereto.

At least one of the gate lines 211-218 and 311-318 may be cut or separated by a gate cut region CT so that a gate line may include a plurality of gate segments. For example, the gate line 212 may include two gate segments 212a and 212b, and the gate line 213 may include four gate segments 213a, 213b, 213c and 213d.

The first flip-flop FF1 including the first master latch ML1 and the first slave latch SL1 may be formed in the first region RG1 between the first power rail 271 and the second power rail 272, and the second flip-flop FF2 including the second master latch ML2 and the second slave latch SL2 may be formed in the second region RG2 between the second power rail 272 and the third power rail 273. As such, the standard cell of FIG. 6 may have a cell height 2CH that is double a cell height CH of normal standard cells, e.g., as shown in FIG. 3, and the standard cell of FIG. 6 may be referred to as a double-height standard cell. In general, a standard cell having a cell height N*CH that is N times (N is an integer greater than one) the normal cell height CH may be referred to as a multi-height standard cell.

The first region RG1 may include a first device area RX11, a second device area RX12, and a first active cut area ACR1 therebetween. The second region RG2 may include a third device area RX21, a fourth device area RX22, and a second active cut area ACR2 therebetween. The region between the first region RG1 and the second region RG2 may be referred to as a boundary region.

In the example embodiment of FIG. 6, the first clock gate line 214 corresponds to a first clock node to which the clock signal CK is applied, the second clock gate line 215 corresponds to a first inversion clock node to which the inverted clock signal CKN is applied, the third clock gate line 314 corresponds to a second clock node to which the clock signal CK is applied, and the fourth clock gate line 315 corresponds to a second inversion clock node to which the inverted clock signal CKN is applied.

Referring to FIGS. 6 and 7A, each clock gate line of the first through fourth clock gate lines 214, 215, 314 and 315 is not cut by a gate cut area in the first and second regions RG1 and RG2. Accordingly, each clock gate line may connect first gate electrodes of clock transistors in the first region RG1 and second gate electrodes of clock transistors in the second region RG2. The first gate electrodes may correspond to portions of each clock gate line, and the second gate electrodes may correspond to other portions of each clock gate line. For example, the gate electrodes of the first and fourth clock transistors MP12 and MN13 formed in the first region RG1 may be electrically connected to the gate electrodes of the ninth and twelfth clock transistors MP22 and MN23 formed in the second region RG2, through the first clock gate line 214.

Referring to FIGS. 6 and 7D, a node generating an output signal of a latch may be formed between two clock gate lines. The node 276 generating the first master output signal SA1 may be formed in the first region RG1 between the first clock gate line 214 and the second clock gate line 215, and the node 277 generating the first slave output signal SC1 may be formed in the first region RG1 between the third clock gate line 314 and the fourth clock gate line 315. The node 278 generating the second master output signal SA2 may be formed in the second region RG2 between the first clock gate line 214 and the second clock gate line 215, and the node 279 generating the second slave output signal SC2 may be formed in the second region RG2 between the third clock gate line 314 and the fourth clock gate line 315.

Referring to FIGS. 6, 7B and 7C, the first master intermediate gate line 212 may be disposed at a side of the first clock gate line 214 and divided into a plurality of gate segments to provide the first inverted master output signal MB1 to the first master latch ML1 and provide the second inverted master output signal MB2 to the second master latch ML2. The first master input gate line 213 may be disposed between the first clock gate line 214 and the first master intermediate gate line 212 and divided into a plurality of gate segments to provide the first input signal MA1 to the first master latch ML1 and provide the second input signal MA2 to the second master latch ML2.

The second master intermediate gate line 217 may be disposed at a side of the second clock gate line 215 and divided into a plurality of gate segments to provide the first inverted master output signal MB1 to the first master latch ML1 and provide the second inverted master output signal MB2 to the second master latch ML2. The second master input gate line 216 may be disposed between the second clock gate line 215 and the second master intermediate gate line 217 and divided into a plurality of gate segments to provide the first input signal MA1 to the first master latch ML1 and provide the second input signal MA2 to the second master latch ML2.

The first slave intermediate gate line 312 may be disposed at a side of the third clock gate line 314 and divided into a plurality of gate segments to provide the first inverted slave output signal SB1 to the first slave latch SL1 and provide the second inverted slave output signal SB2 to the second slave latch SL2. The first slave input gate line 313 may be disposed between the third clock gate line 314 and the first slave intermediate gate line 312 and divided into a plurality of gate segments to provide the first master output signal SA1 to the first slave latch SL1 and provide the second master output signal SA2 to the second slave latch SL2.

The second slave intermediate gate line 317 may be disposed at a side of the fourth clock gate line 315 and divided into a plurality of gate segments to provide the first inverted slave output signal SB1 to the first slave latch SL1 and provide the second inverted slave output signal SB2 to the second slave latch SL2. The second slave input gate line 316 may be disposed between the fourth clock gate line 315 and the second slave intermediate gate line 317 and divided into a plurality of gate segments to provide the first master output signal SA1 to the first slave latch SL1 and provide the second master output signal SA2 to the second slave latch SL2.

In some example embodiments, as illustrated in FIG. 6, the power supply voltage VDD may be applied to the first power rail 271 and the third power rail 273, and the ground voltage VSS may be applied to the second power rail 272. In this case, the P-type transistors MP11-MP14, SP11-SP14, MP21-MP24 and SP21-SP24 may be formed in the first and fourth device areas RX11 and RX22, and the N-type transistors MN11-MN14, SN11-SN14, MN21-MN24 and SN21-SN24 may be formed in the second and third device areas RX12 and RX21.

One of two gate lines providing the same signal may form gate electrodes of PMOS transistors, and the other of the two gate lines may form gate electrodes of NMOS transistors. As illustrated in FIG. 6, one of the first master intermediate gate line 212 and the second master intermediate gate line 217 forms a gate electrode of PMOS transistor and the other of the first master intermediate gate line 212 and the second master intermediate gate line 217 forms a gate electrode of an NMOS transistor. One of the first slave intermediate gate line 312 and the second slave intermediate gate line 317 forms a gate electrode of a PMOS transistor, and the other of the first slave intermediate gate line 312 and the second slave intermediate gate line 317 forms a gate electrode of an NMOS transistor. One of the first master input line 213 and the second master input gate line 216 forms a gate electrode of a PMOS transistor and the other of the first master input gate line 213, and the second master input gate line 216 forms a gate electrode of an NMOS transistor. One of the first slave input gate line 313 and the second slave input gate line 316 forms a gate electrode of a PMOS transistor, and the other of the first slave input gate line 313 and the second slave input gate line 316 forms a gate electrode of an NMOS transistor.

For example, in case of the first master intermediate gate line 212 and the second master intermediate gate line 217 that provide the first inverted master output signal MB1 and the second inverted master output signal MB2 in FIG. 6, the first master intermediate gate line 212 may form the gate electrodes of the NMOS transistors MN14 and MN24, and the second master intermediate gate line 217 may form the gate electrodes of the PMOS transistors MP13 and MP23.

Each gate line of the first master intermediate gate line 212, the second master intermediate gate line 217, the first slave intermediate gate line 312 and the second slave intermediate gate line 317 may be cut at a boundary region between the first region RG1 and the second region RG1 to be divided into two gate segments. Each of the two segments may form a gate electrode and an electrode of each of capacitors CP11-CP14 and CP21-CP24. For example, the one gate segment 212a of the first master intermediate gate line 212 may form the gate electrode of the transistor MN14 and the electrode of the capacitor CP11.

Each gate line of the first master input gate line 213, the second master input gate line 216, the first slave input gate line 313, and the second slave input gate line 316 may be cut at the first region RG1, at the second region RG2 and at a boundary region between the first region RG1 and the second region RG2 to be divided into four gate segments. In each of the first master input gate line 213 and the second master input gate line 216, the first input signal MA1 and the second input signal MA2 may be applied to two gate segments of the four gate segments, respectively, and each of the other two gate segments of the four gate segments may form a portion of a jumper structure connecting active areas at both sides of a corresponding one of the first master input gate line 213, the second master input gate line 216, the first slave input gate line 313 and the second slave input gate line 316. Likewise, in each of the first slave input gate line 313 and the second slave input gate line 316, the first master output signal SA1 and the second master output signal SA2 may be applied to two gate segments of the four gate segments, respectively, and each of the other two gate segments of the four gate segments may form a portion of a jumper structure connecting active areas at both sides.

For example, the second master input gate line 216 may be divided into four gate segments 216a, 216b, 216c and 216d. The first input signal MA1 and the second input signal MA2 may be applied to the two gate segments 216b and 216c, and each of the other two gate segments 216a and 216d may form a portion of a jumper structure connecting active areas at both sides, as will be described with reference to FIG. 7E.

The active areas in both sides of a dummy gate segment may be connected through a jumper structure. For example, as illustrated in FIG. 7E, a jumper structure JMP may include first contacts CA 194 and 195 formed on active areas 114 and 115 and a second contact CB 196 formed on the gate segment 216a. The jumper structure JMP may be formed by combining the first contacts CA 194 and 195 and the second contact CB 196 as a form of one body. Using such jumper structure JMP, the gate segment 216a may be connected to the active areas 114 and 115.

In FIG. 6, the gate lines 211, 218, 311 and 318 disposed at side areas of the latches may be dummy gate lines and may be omitted.

FIGS. 8A-8D are diagrams illustrating example embodiments of a layout of an integrated circuit according to example embodiments.

Referring to FIGS. 8A-8D, positions of vias 411-414 for connecting the clock gate lines GL1-GL4 to upper wirings (not shown) may be determined variously. In case of an integrated circuit 203 of FIG. 8A and an integrated circuit 204 of FIG. 8B, a distance DCK between two clock gate lines to which the clock signal CK is applied may be equal to a distance DCKN between two clock gate lines to which the inverted clock signal CKN is applied. In case of an integrated circuit 205 of FIG. 8C and an integrated circuit 206 of FIG. 8D, the distance DCK between two clock gate lines to which the clock signal CK is applied may be different from the distance DCKN between two clock gate lines to which the inverted clock signal CKN is applied.

Figure 8A:
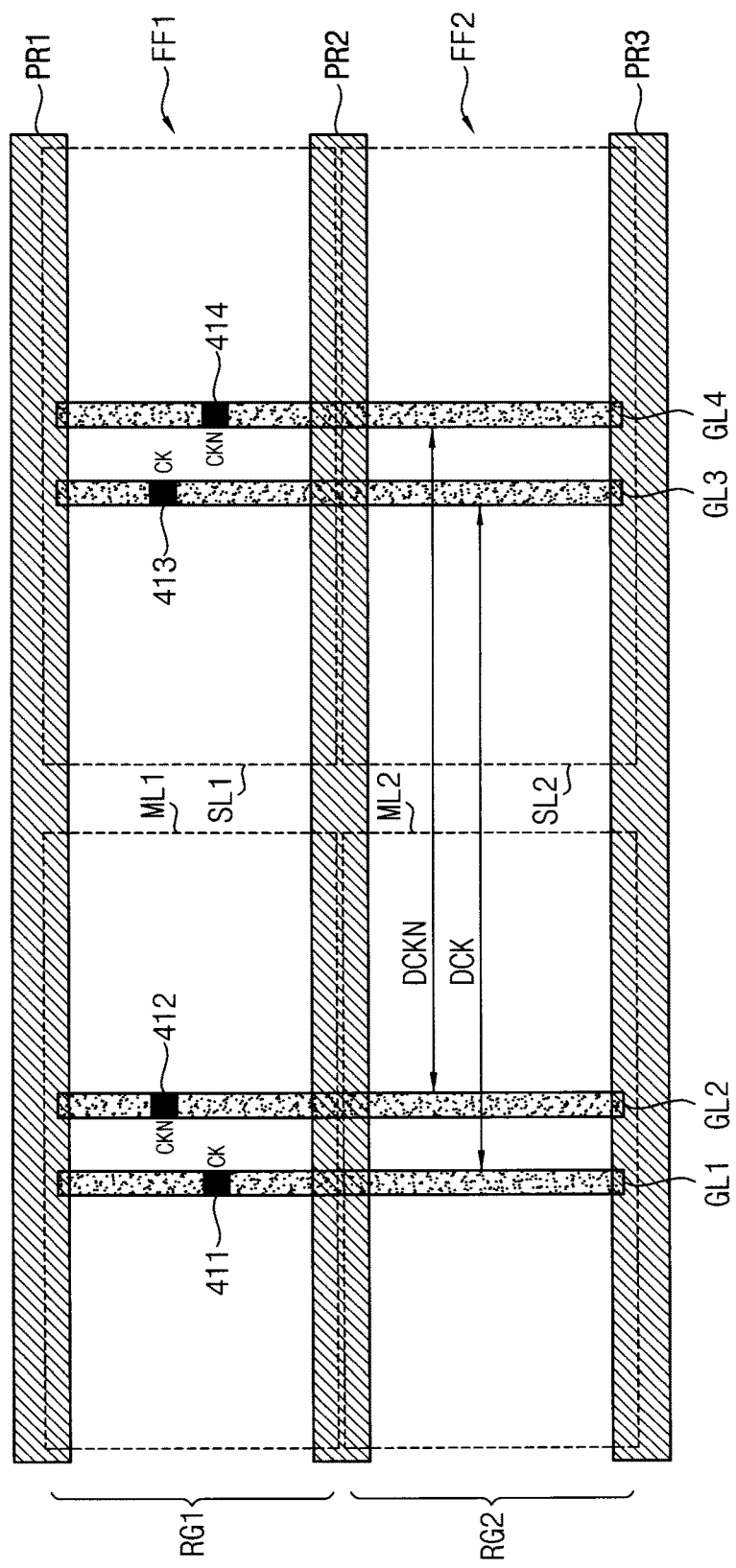
FIGS. 8A, 8B, 8C and 8D are diagrams illustrating example embodiments of a layout of an integrated circuit according to example embodiments.
Figure 8B:
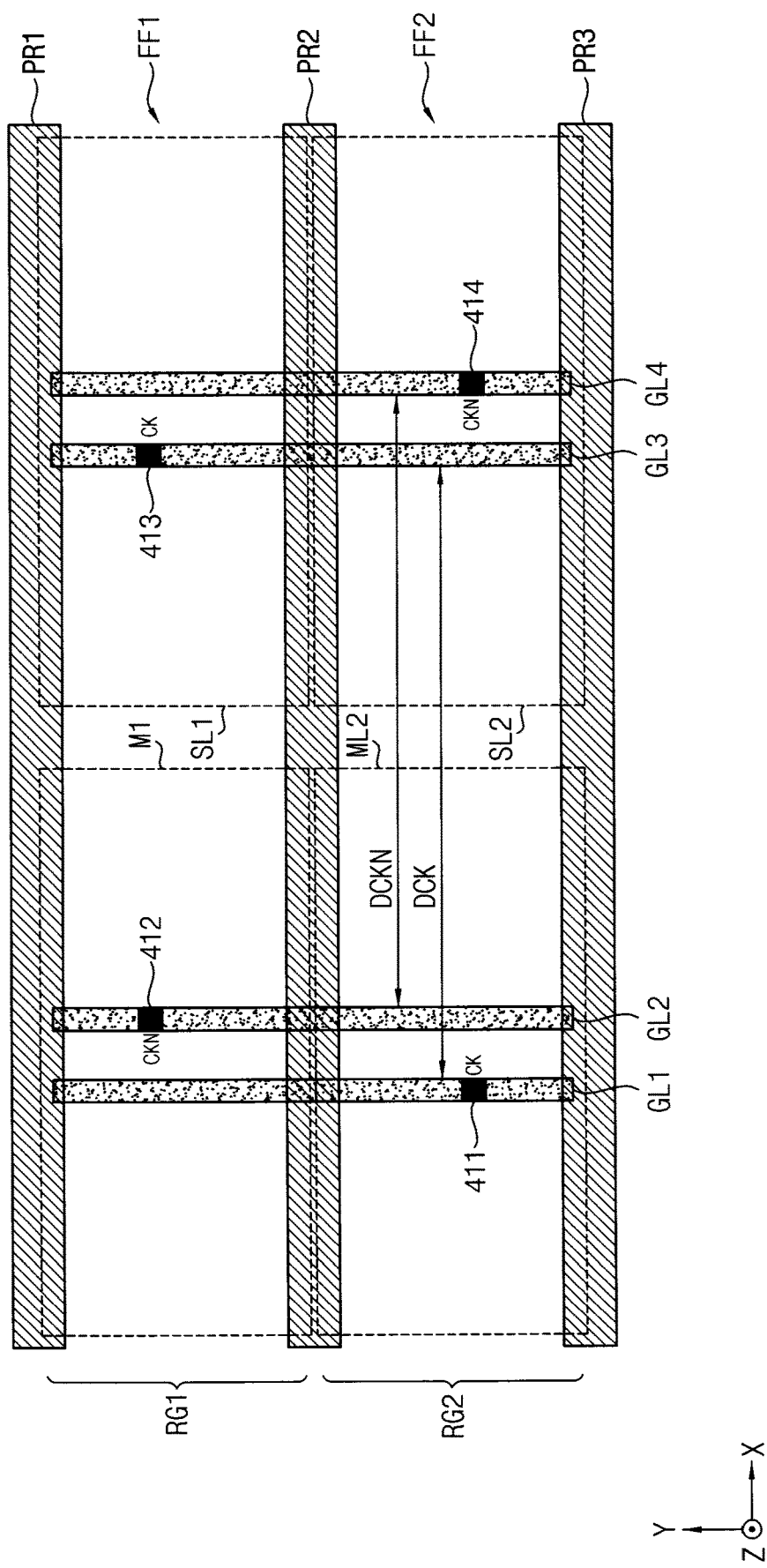
Figure 8C:
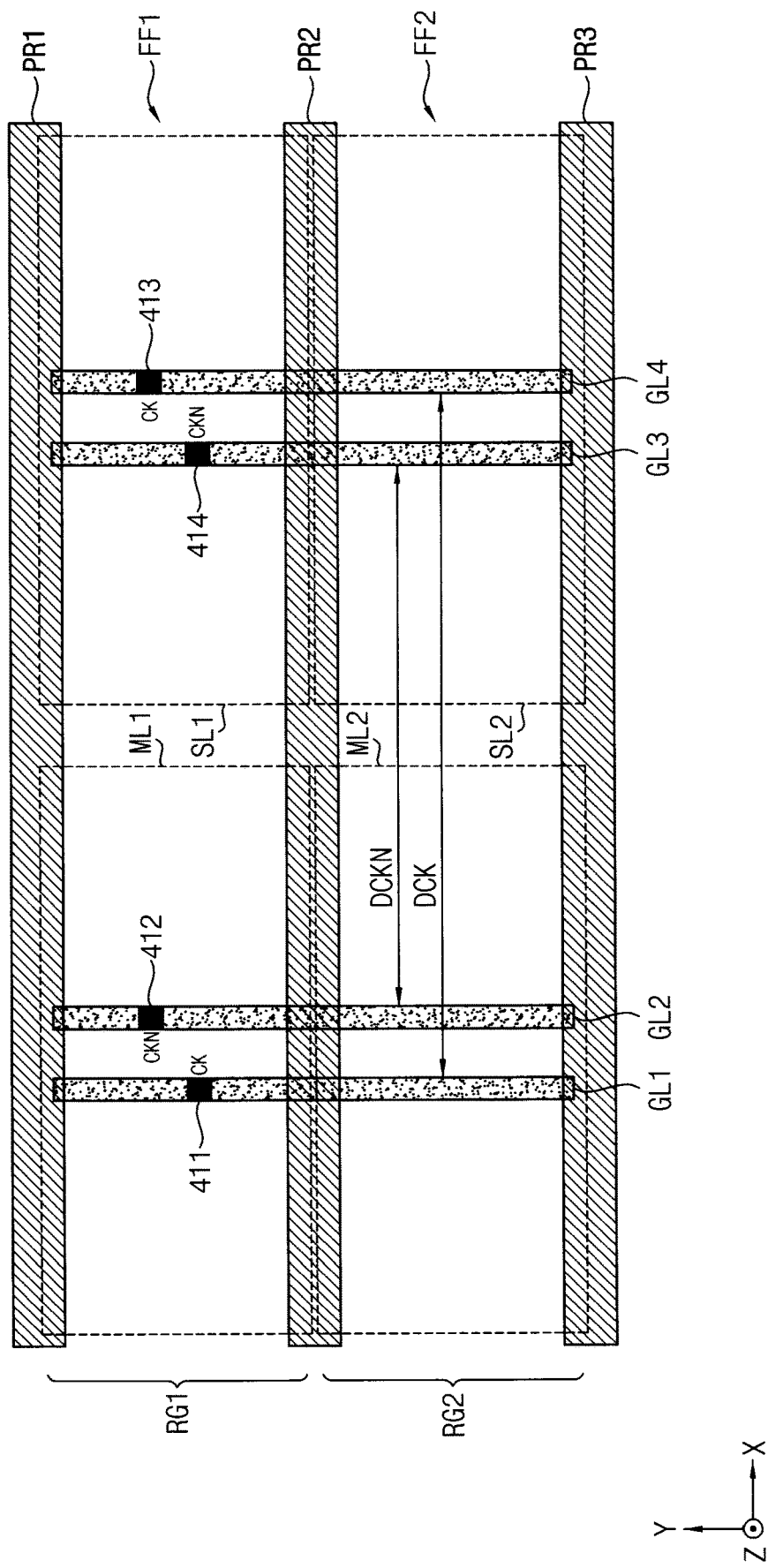
Figure 8D:
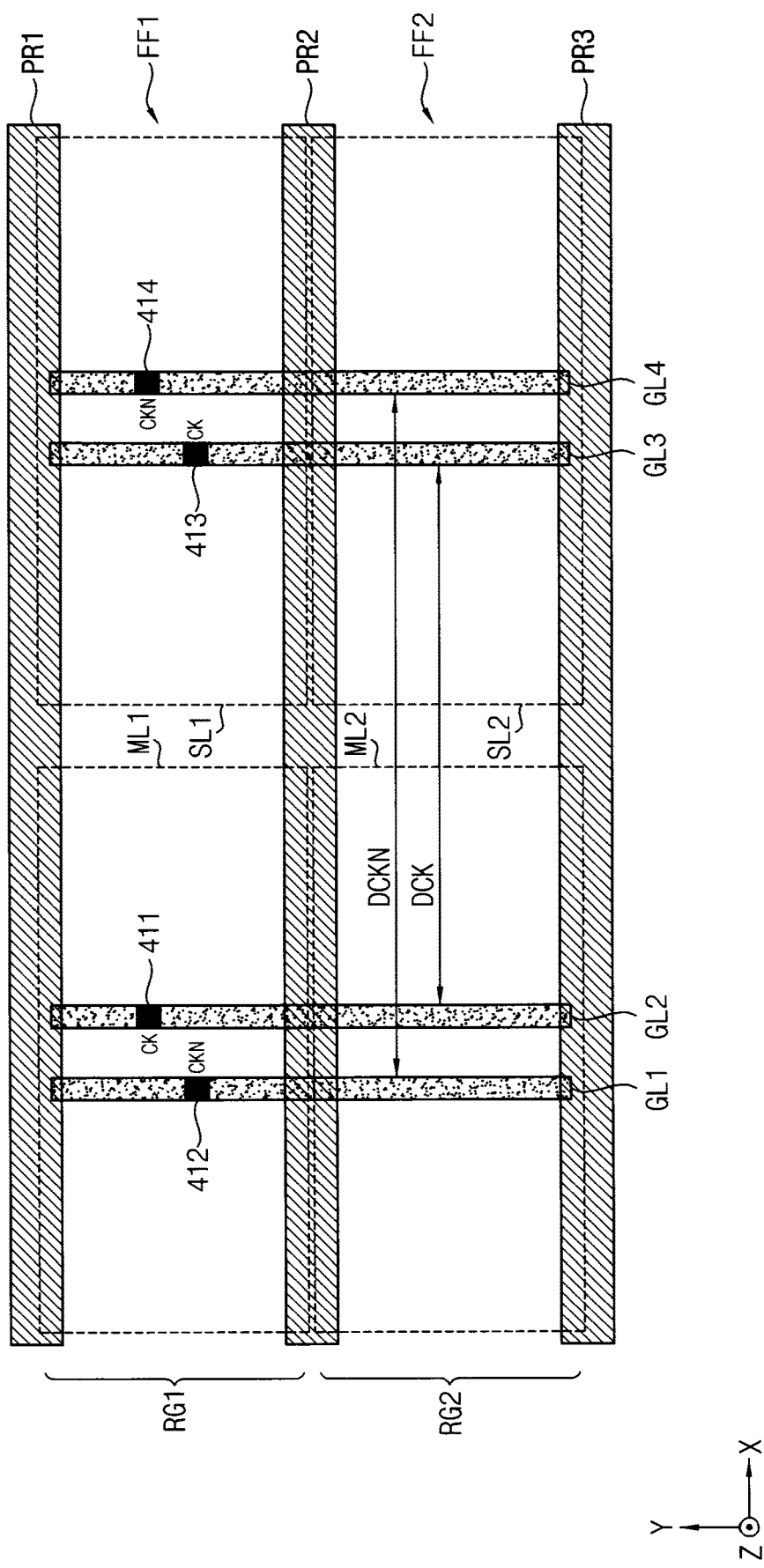

As illustrated in FIGS. 8A through 8D, all of the vias 411-414 may be formed in the first region RG1 as illustrated in FIGS. 8A, 8C and 8D, or the vias 411-414 may be distributed in the first and second regions RG1 and RG2 as illustrated in FIG. 8B. Even though not illustrated in the drawings, all of the vias 411-414 may be formed in the second region RG2.

FIGS. 9-12 are diagrams illustrating example embodiments of a layout of a standard cell corresponding to the integrated circuit of FIG. 5. The descriptions repeated with FIG. 6 may be omitted.

Figure 9:
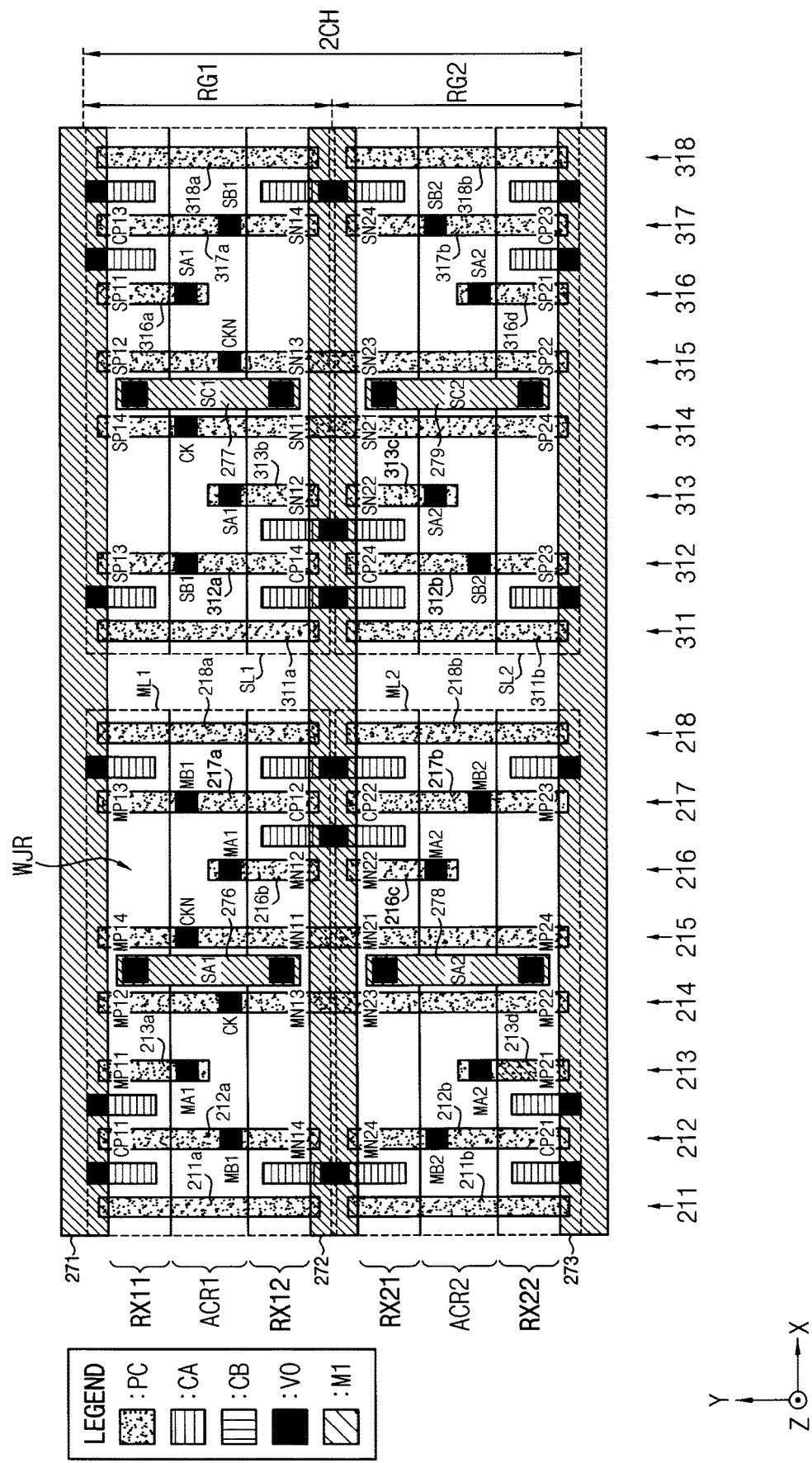
FIGS. 9, 10, 11 and 12 are diagrams illustrating example embodiments of a layout of a standard cell corresponding to the integrated circuit of FIG. 5.

Referring to FIG. 9, the jumper structure JMP in FIG. 6 may be replaced with a wide junction region WJR in FIG. 9. In the example embodiment of FIG. 6, each gate line of the first master input gate line 213, the second master input gate line 216, the first slave input gate line 313 and the second slave input gate line 316 is cut and divided into four gate segments, and two gate segments of these four gate segments form portions of the jumper structures JMP. In contrast, in the example embodiment of FIG. 9, the two gate segments forming the portions of the jumper structures JMP are removed. In the wide junction region WJR, the upper elements 216a, 194, 195 and 196 (FIG. 7E) are removed and the active areas 114 and 115 (FIG. 7E) are combined to form a wide active area. The wide junction region WJR in FIG. 9 may be applicable to the bulk CMOS processes, and the jumper structure JMP may be applicable to the FinFET processes.

Figure 10:
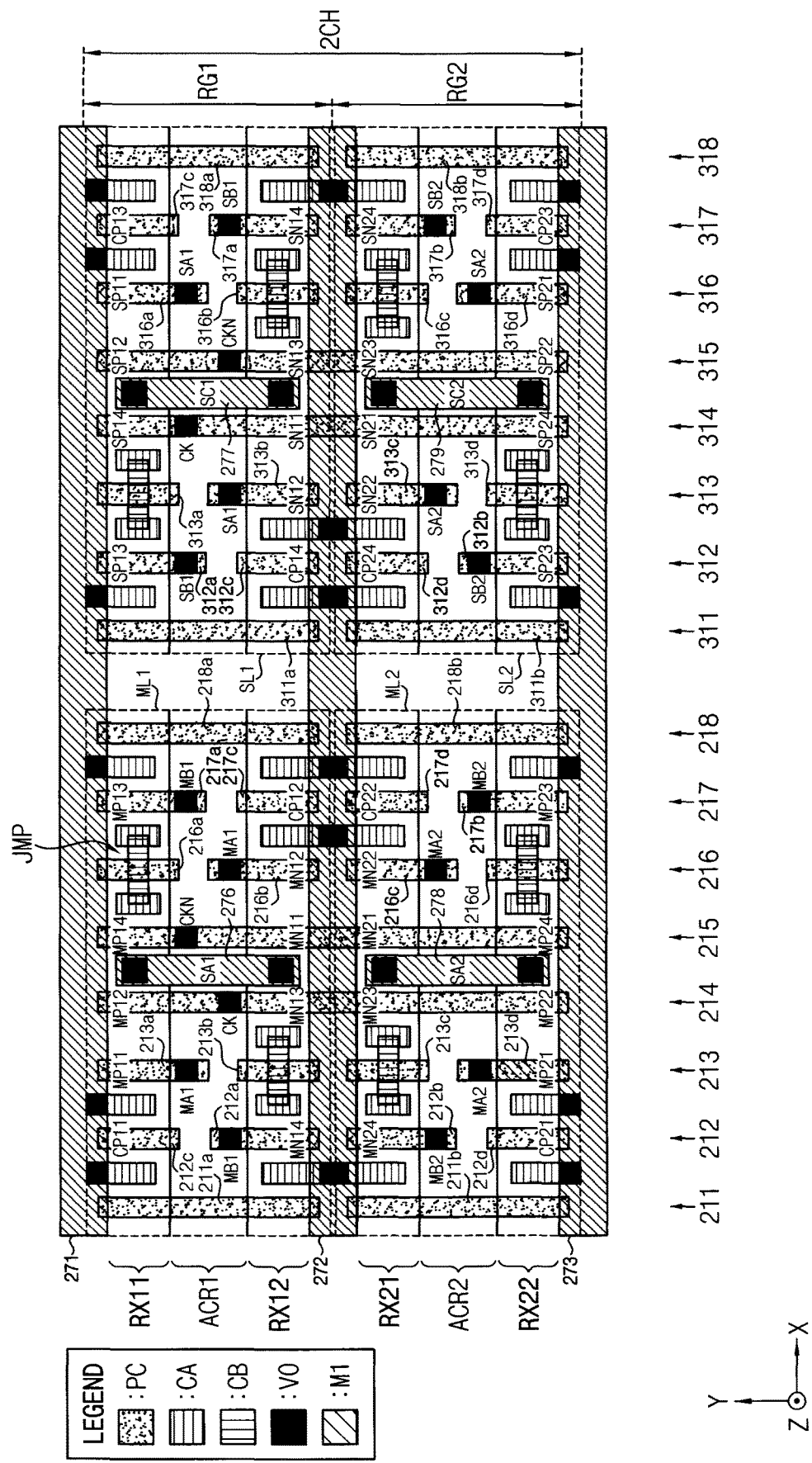

Referring to FIG. 10, each gate line of the first master intermediate gate line 212, the second master intermediate gate line 217, the first slave intermediate gate line 312 and the second slave intermediate gate line 317 may be cut at the first region RG1, at the second region RG2 and at the boundary region between the first region RG1 and the second region RG1 to be divided into four gate segments. The first inverted master output signal MB1 and the second inverted master output signal MB2, or the first inverted slave output signal SB1 and the second inverted slave output signal SB2 may be applied to two gate segments of the four gate segments, respectively, and each of the other two gate segments of the four gate segments may form an electrode of a capacitor.

For example, the second master intermediate gate line 217 may be divided into four gate segments 217a-217d. The first inverted master output signal MB1 and the second inverted master output signal MB2 may be applied respectively to the two gate segments 217a and 217b, and the two gate segments 217c and 217d may form the electrodes of the capacitors CP12 and CP22. In case of the example embodiment of FIG. 6, one gate segment forms the gate electrode of a transistor and also the electrode of a capacitor. In contrast, in the example embodiment of FIG. 10, the gate electrode may be separated from the capacitor electrode, and the loads of the nodes of the first inverted master output signal MB1, the second inverted master output signal MB2, the first inverted slave output signal SB1 and the second inverted slave output signal SB2 may be reduced.

Figure 11:
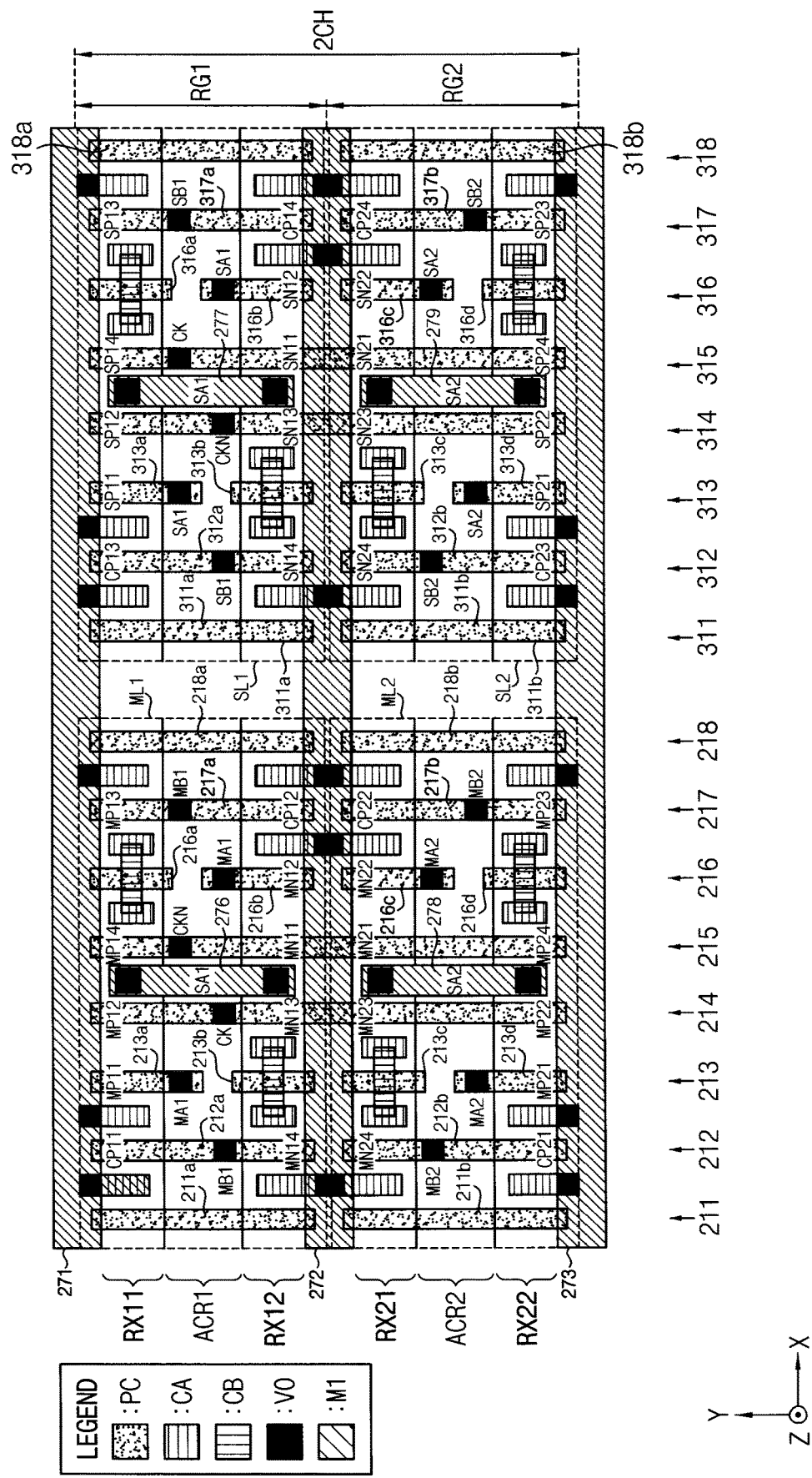

Referring to FIG. 11, the first clock gate line 214 corresponds to a first clock node to which the clock signal CK is applied, the second clock gate line 215 corresponds to a first inversion clock node to which the inverted clock signal CKN is applied, the third clock gate line 314 corresponds to a second inversion clock node to which the inverted clock signal CKN is applied, and the fourth clock gate line 315 corresponds to a second clock node to which the clock signal CK is applied. Comparing the example embodiments of FIGS. 6 and 11, the second clock node is exchanged with the second inversion clock node.

As a result, the layouts of the master latches ML1 and ML2 are substantially the same as the layouts of the slave latches SL1 and SL2 in case of FIG. 11, whereas the layouts are symmetrical in case of FIG. 6.

As such, the arrangement of the transistors may be determined based on setting of the clock nodes and the inversion clock nodes among the first through fourth clock gate lines 214, 215, 314 and 315. Even though not illustrated in the drawings, the ground voltage VSS may be applied to the first power rail 271 and the third power rail 273, and the power supply voltage VDD may be applied to the second power rail 272. In this case, the clock routing structure of the above described embodiments may be maintained, but the PMOS transistors may be exchanged with the NMOS transistors.

Figure 12:
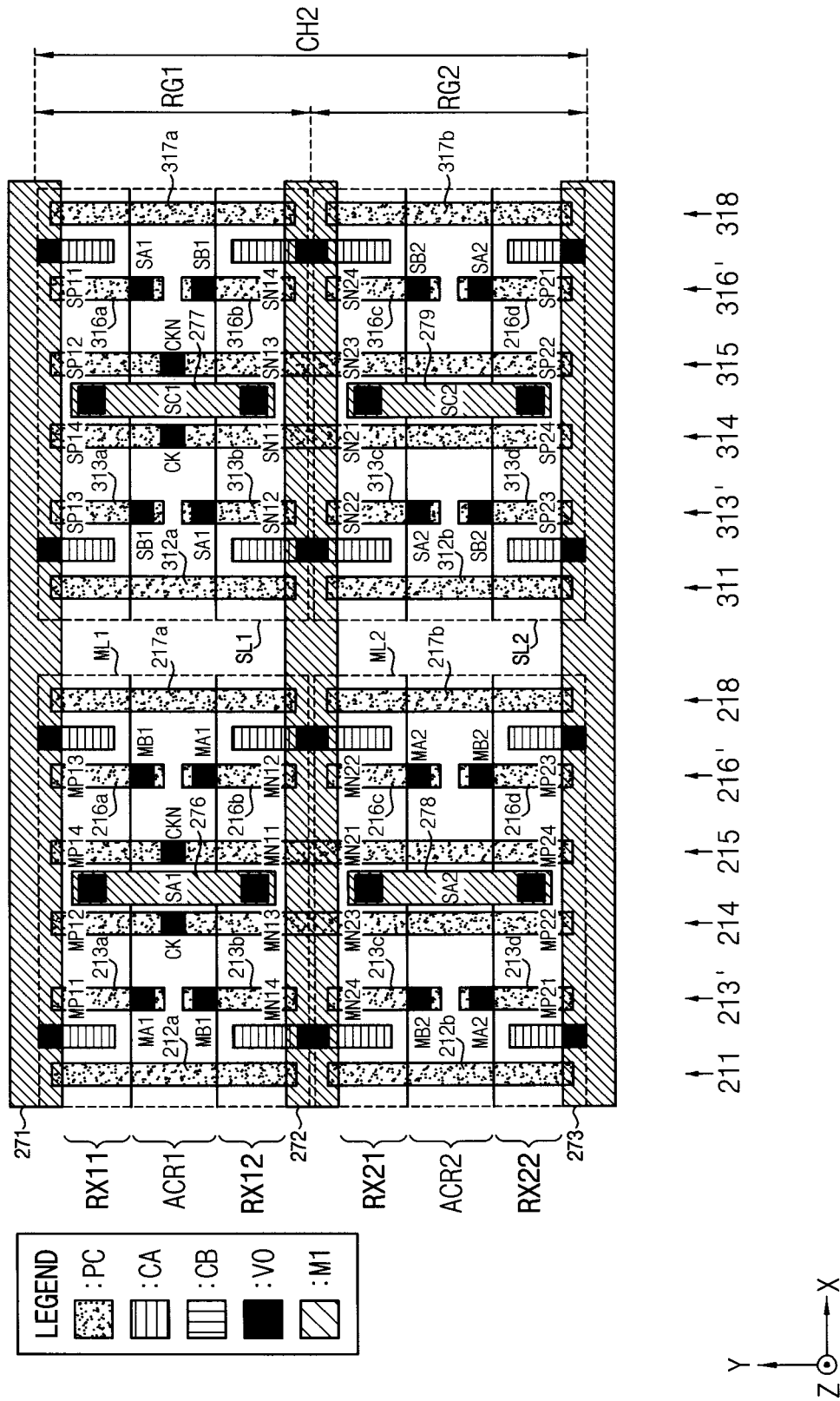

Referring to FIG. 12, the first master intermediate gate line 212 and the first master input gate line 213 in FIG. 6 may be replaced with a first master gate line 213', the second master intermediate gate line 217 and the second master input gate line 216 may be replaced with a second master gate line 216', the first slave intermediate gate line 312 and the first slave input gate line 313 in FIG. 6 may be replaced with a first slave gate line 313', the second slave intermediate gate line 317 and the second slave input gate line 316 may be replaced with a second slave gate line 316'.

The first master gate line 213' may be disposed at a side of the first clock gate line 214 and divided into a plurality of gate segments 213a-213d to provide the first input signal MA1 and the first inverted master output signal MB1 to the first master latch ML1 and provide the second input signal MA2 and the second inverted master output signal MB2 to the second master latch ML2.

The second master gate line 216' may be disposed at a side of the second clock gate line 215 and divided into a plurality of gate segments 216a-216d to provide the first input signal MA1 and the first inverted master output signal MB1 to the first master latch ML1 and provide the second input signal MA2 and the second inverted master output signal MB2 to the second master latch ML2.

The first slave gate line 313' may be disposed at a side of the third clock gate line 314 and divided into a plurality of gate segments 313a-313d to provide the first master output signal SA1 and the first inverted slave output signal SB1 to the first slave latch SL1 and provide the second master output signal SA2 and the second inverted slave output signal SB2 to the second slave latch SL2.

The second slave gate line 316' may be disposed at a side of the fourth clock gate line 315 and divided into a plurality of gate segments 316a-316d to provide the first master output signal SA1 and the first inverted slave output signal SB1 to the first slave latch SL1 and provide the second master output signal SA2 and the second inverted slave output signal SB2 to the second slave latch SL2.

As such, the clock routing structure including the first through fourth clock gate lines 214, 215, 314 and 315 may be maintained, and one intermediate gate line and one input gate line may be combined to one gate line. The example embodiment of FIG. 12 is applicable when the cell height is secured sufficiently, and may reduce an occupation area and loads of a multi-height standard cell.

Figure 13:
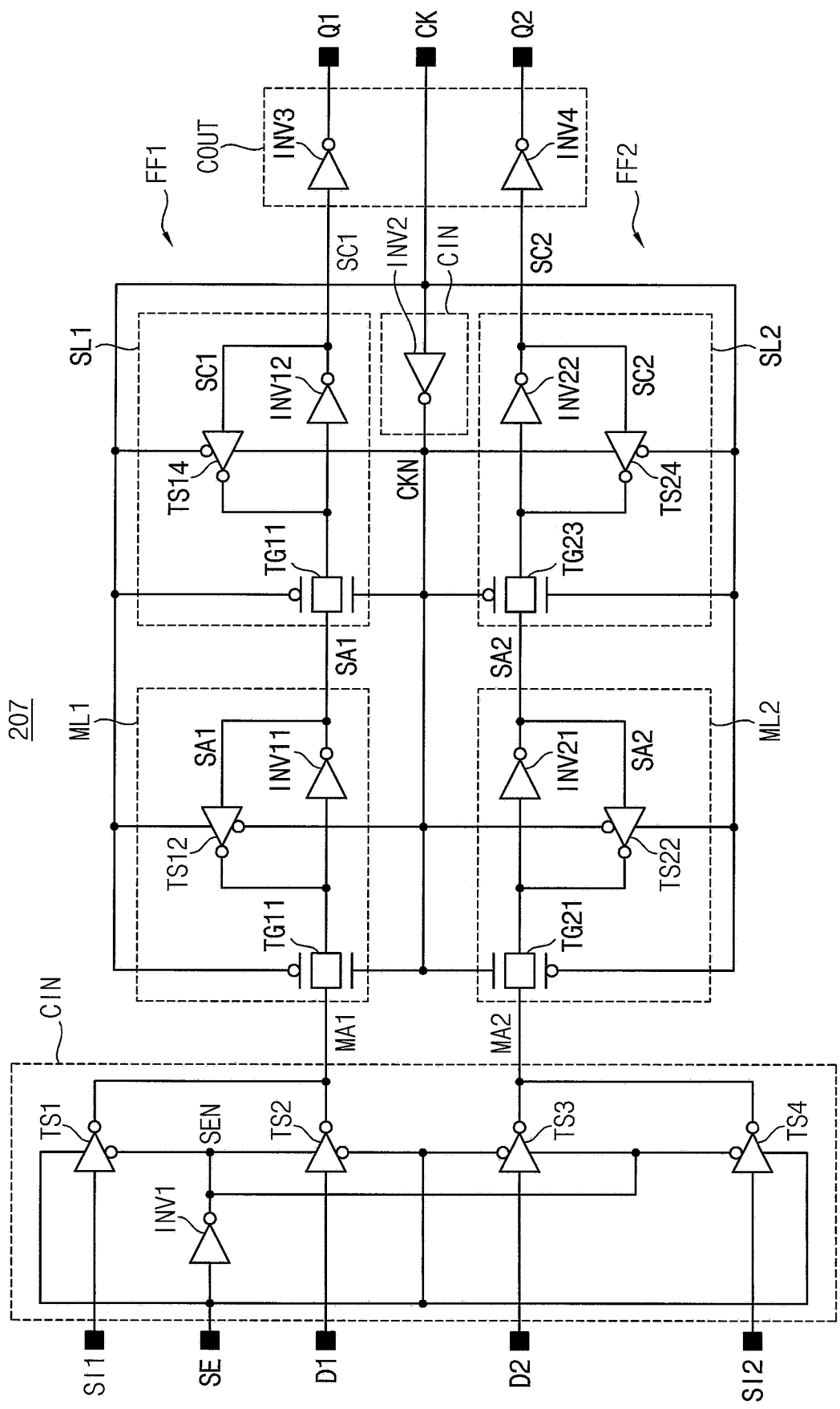
FIG. 13 is diagram illustrating an example embodiment of an integrated circuit applicable to the layout of FIG. 1.

FIG. 13 is diagram illustrating an example embodiment of an integrated circuit applicable to the layout of FIG. 1.

Referring to FIG. 13, an integrated circuit 207 may have a configuration that the tri-state inverters TS11, TS13, TS21 and TS23 in FIG. 2A are replaced with transmission gates TG11, TG13, TG21 and TG23 and the dispositions of the inverters INV11, INV12, INV21 and INV22 are changed in comparison with FIG. 2A.

Each of the transmission gates TG11, TG13, TG21 and TG23 in FIG. 13 includes two clock transistors receiving the clock signal CK and the inverted clock signal CKN in the same way as the tri-state inverters TS11, TS13, TS21 and TS23 in FIG. 2A. Accordingly, the efficient clock routing structure including the first through fourth clock gate lines GL1-GL4 as described above referring to FIG. 1 may be applicable to the integrated circuit 207 of FIG. 13.

Figure 14:
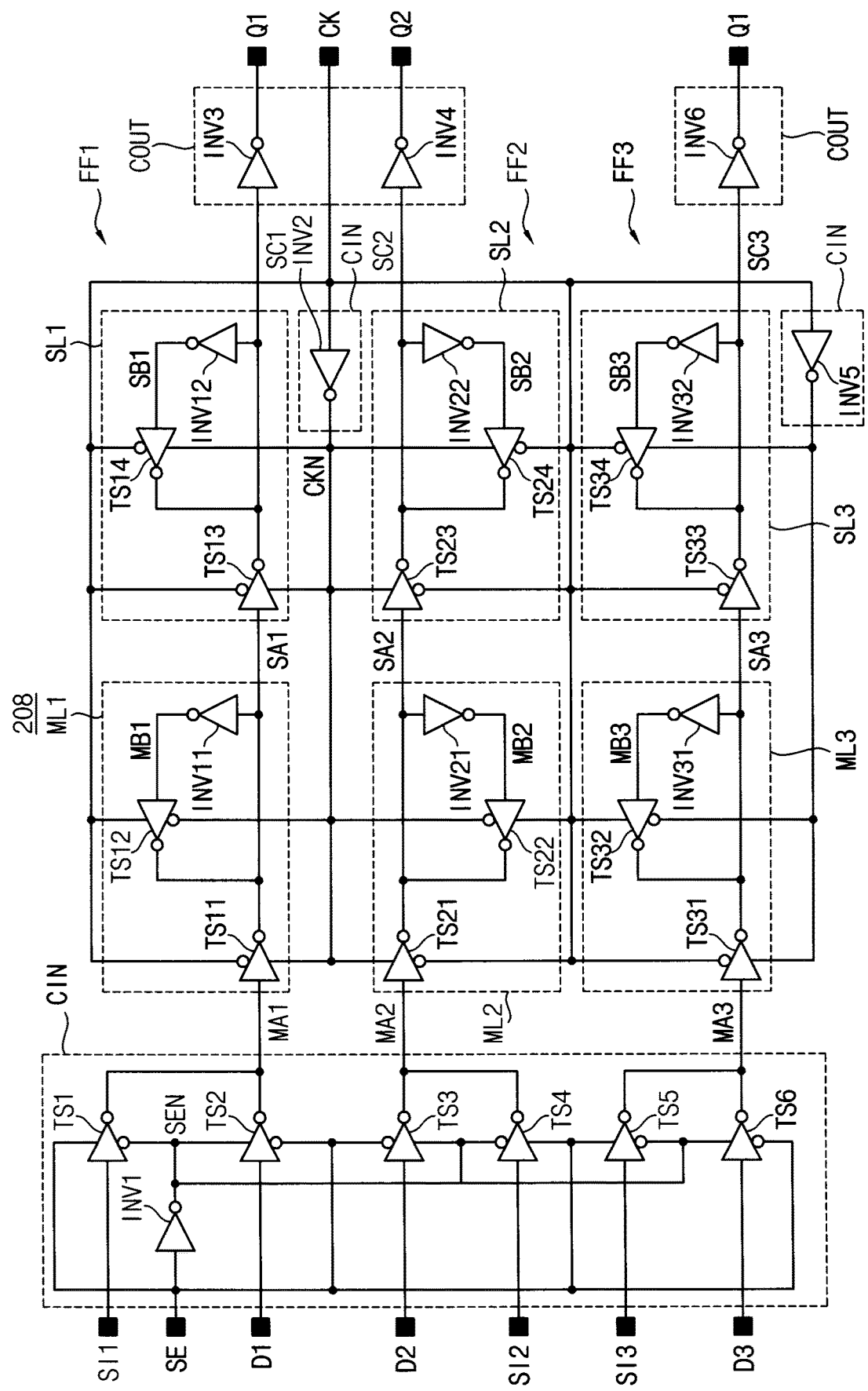
FIG. 14 is a diagram illustrating an example embodiment of an integrated circuit applicable to a layout having a clock routing structure according to example embodiments.

FIG. 14 is a diagram illustrating an example embodiment of an integrated circuit applicable to a layout having a clock routing structure according to example embodiments.

Referring to FIG. 14, an integrated circuit 208 of FIG. 14 corresponds to an example of a three-bit flip-flop circuit of a master-slave type. The integrated circuit 201 may include a first flip-flop FF1, a second flip-flop FF2 and a third flip-flop FF3. In some example embodiments, the integrated circuit 208 may further include an input circuit CIN and an output circuit COUT. The integrated circuit 208 of FIG. 14 is substantially the same as the integrated circuit 201 of FIG. 2A, except the integrated circuit 208 further include the third flip-flop FF3 and related circuit elements TS5, TS6, INV5 and INV6, and the repeated descriptions are omitted.

The third flip-flop FF3 may include a third master latch ML2 and a third slave latch SL3. The third master latch ML3 may latch a third input signal MA3 in synchronization with the clock signal CK and the inverted clock signal CKN to generate a third master output signal SA3. The third slave latch SL3 may latch the third master output signal SA3 in synchronization with the clock signal CK and the inverted clock signal CKN to generate a third slave output signal SC3. The third master latch ML3 may include a ninth tri-state inverter TS31, a tenth tri-state inverter TS32 and an inverter INV31, and the third slave latch SL3 may include an eleventh tri-state inverter TS33, a twelfth tri-state inverter TS34 and an inverter INV32.

The ninth through twelfth tri-state inverters TS31-TS34 operate in synchronization with the clock signal CK and the inverted clock signal CKN. An input node of the ninth tri-state inverter TS31 corresponds to a node of the third input signal MA3 and an output node of the third tri-state inverter TS31 corresponds to a node of the third master output signal SA3. In other words, the third tri-state inverter TS31 receives the third input signal MA3 and outputs the third master output signal SA3. The tenth tri-state inverter TS32 receives a third inverted master output signal MB3 and outputs the third master output signal SA3. The eleventh tri-state inverter TS33 receives the third master output signal SA3 and outputs the third slave output signal SC3. The twelfth tri-state inverter TS34 receives a third inverted slave output signal SB3 and outputs the third slave output signal SC3.

Figure 15:
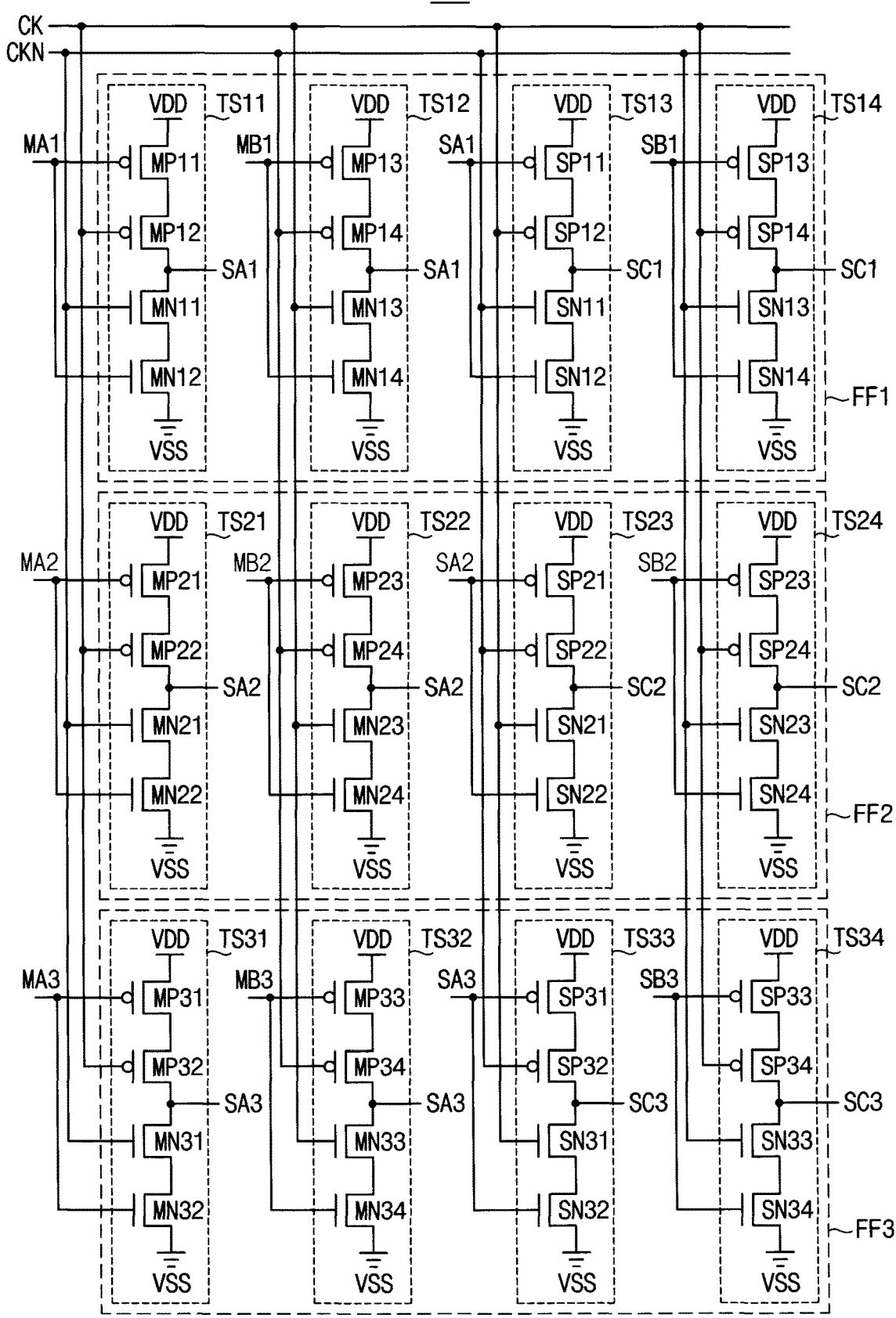
FIG. 15 is a circuit diagram illustrating an integrated circuit according to example embodiments.
Figure 16:
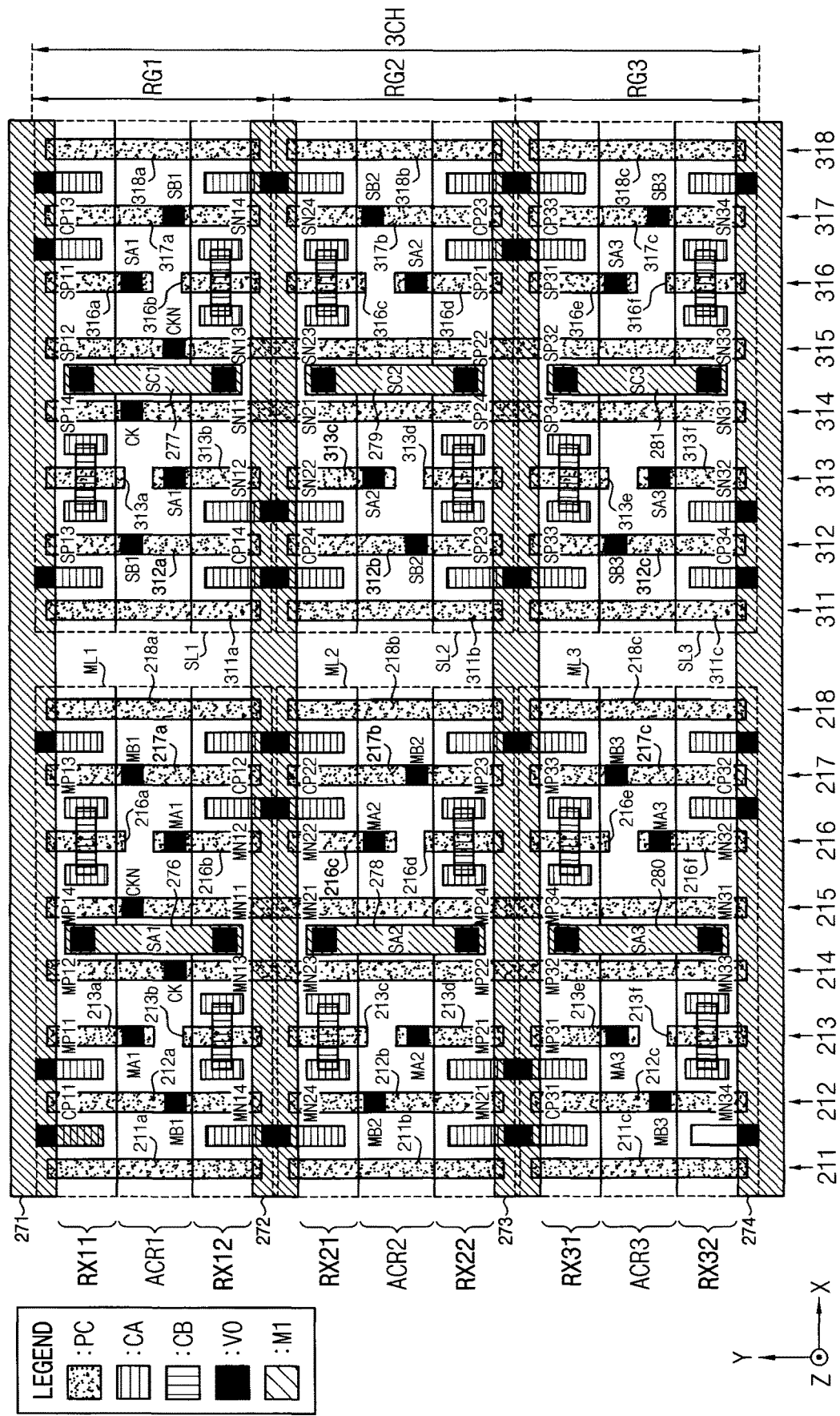
FIG. 16 is a diagram illustrating an example embodiment of a layout of a standard cell corresponding to the integrated circuit of FIG. 15.

FIG. 15 is a circuit diagram illustrating an integrated circuit according to example embodiments, and FIG. 16 is a diagram illustrating an example embodiment of a layout of a standard cell corresponding to the integrated circuit of FIG. 15. An integrated circuit 209 of FIG. 15 and the layout of FIG. 16 are substantially the same as the integrated circuit 202 of FIG. 5 and the layout of FIG. 6, except the integrated circuit 209 further include the third flip-flop FF3, and the repeated descriptions are omitted.

Referring to FIGS. 15 and 16, the third flip-flop FF3 may include the ninth through twelfth tri-state inverters TS31-TS34 operating in synchronization with the clock signal CK and the inverted clock signal CKN.

The ninth tri-state inverter TS31 may include a seventeenth clock transistor MP32 pulling up the node generating the third master output signal SA3 (that is, the node SA3) in response to the clock signal CK and a eighteenth clock transistor MN31 pulling down the node SA3 in response to the inverted clock signal CKN. The tenth tri-state inverter TS32 may include a nineteenth clock transistor MP34 pulling up the node generating the third master output signal SA3 (that is, the node SA3) in response to the inverted clock signal CKN and a twentieth clock transistor MN33 pulling down the node SA3 in response to the clock signal CK. The eleventh tri-state inverter TS33 may include a twenty first clock transistor SP32 pulling up the node SC3 in response to the inverted clock signal CKN and a twenty second clock transistor SN31 pulling down the node SC3 in response to the clock signal CK. The twelfth tri-state inverter TS34 may include a twenty third clock transistor SP34 pulling up the node SC3 in response to the clock signal CK and a twenty fourth clock transistor SN33 pulling down the node SC3 in response to the inverted clock signal CKN.

As described above, each of the input PMOS transistors MP31, MP33, SP31 and SP33 and the input NMOS transistors MN32, MN34, SN32 and SN34 may connect a corresponding clock transistor to one of the power supply voltage VDD and the ground voltage VSS in response to corresponding one of the received signals MA3, MB3, SA3 and SB3.

As illustrated in FIG. 16, the integrated circuit 208 including the three flip-flops FF1, FF2 and FF3 may be implemented with a layout of a standard cell in which first through fourth clock gate lines 214, 215, 314 and 315 cover first, second and third regions RG1, RG2 and RG3 between first through fourth power rails 271, 272, 273 and 274 that are sequentially arranged in the second direction Y. As such, the standard cell of FIG. 16 may have a cell height 3CH that is triple a cell height CH of normal standard cells, e.g., as shown in FIG. 3, and the standard cell of FIG. 16 may be referred to as a triple-height standard cell. In general, a standard cell having a cell height N*CH that is N times (N is an integer greater than one) the normal cell height CH may be referred to as a multi-height standard cell.

Figure 17:
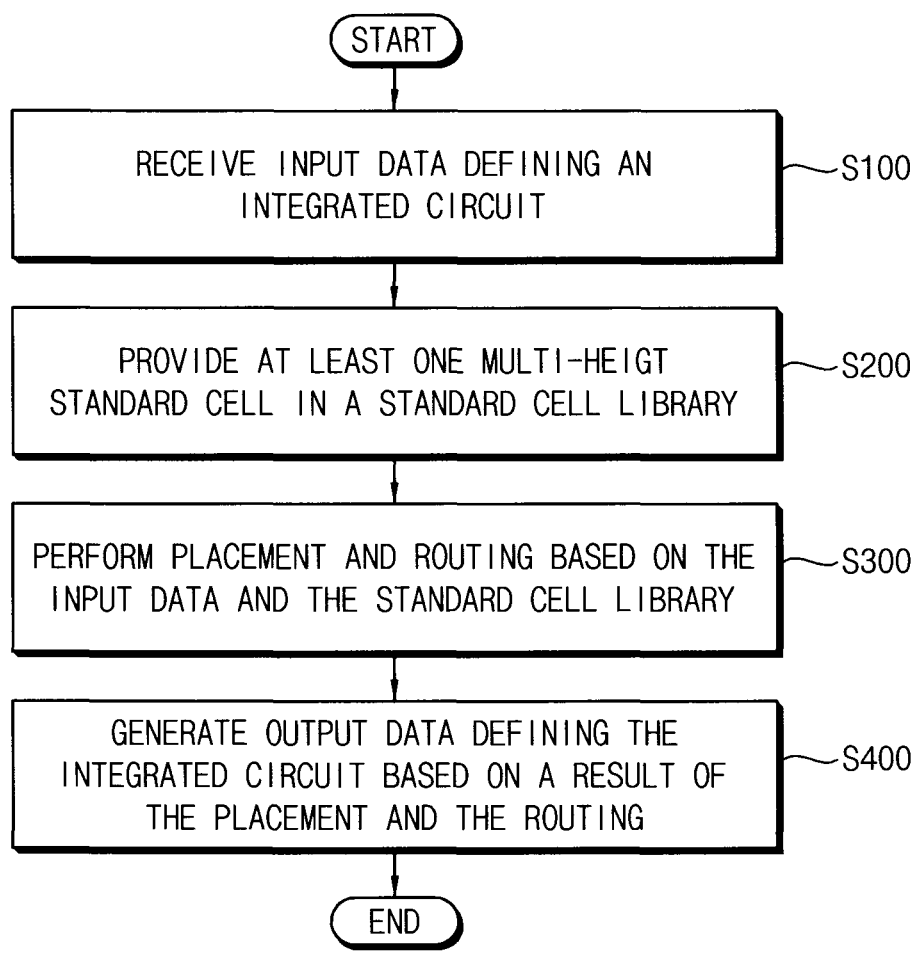
FIG. 17 is a diagram illustrating a method of designing an integrated circuit according to example embodiments.

FIG. 17 is a diagram illustrating a method of designing an integrated circuit according to example embodiments.

The method of FIG. 17 may include a method of designing a layout of the integrated circuit that is performed by a designing tool. In some example embodiments, the designing tool may include a programming software including a plurality of instructions executable by a processor, i.e., software implemented in some form of hardware (e.g. processor, ASIC, etc.).

Referring to FIG. 17, input data defining the integrated circuit may be received (S100). For example, an integrated circuit may be defined by a plurality of cells and the integrated circuit may be designed using a cell library including information about the cells. Hereinafter, a cell may be a standard cell and a cell library may be a standard cell library.

In some example embodiments, the input data may be data generated from an abstract form with respect to behavior of the integrated circuit. For example, the input data may be defined in a register transfer level (RTL) through synthesis using the standard cell library. For example, the input data may be a bitstream and/or a netlist that are generated by synthesizing the integrated circuit defined by a hardware description language (HDL) such as VHSIC hardware description language (VHDL) or Verilog.

In some example embodiments, the input data may be data for defining the layout of the integrated circuit. For example, the input data may include geometric information for defining a structure implemented as a semiconductor material, a metal, and an insulator. A layout of the integrated circuit indicated by the input data may have a layout of the cells and conducting wires used to connect a cell to other cells, for example.

At least one multi-height standard cell is provided in a standard cell library (S200). The term "standard cell" may refer to a unit of an integrated circuit in which a size of the layout meets a preset or specified rule. The standard cell may include an input pin and an output pin, and may process a signal received through the input pin to output a signal through the output pin. For example, the standard cell may be a basic cell such as an AND logic gate, an OR logic gate, a NOR logic gate, or an inverter, a complex cell such as an OR/AND/INVERTER (OAI) or an AND/OR/INVERTER (AOI), and a storage element such as a master-slave flip-flop or a latch.

The multi-height standard cell may include a clock routing structure and transistor disposition based on the clock routing structure as described above with reference to FIGS. 1 through 16.

The standard cell library may include information about a plurality of standard cells. For example, the standard cell library may include a name and a function of a standard cell, as well as timing information, power information, and layout information about the standard cell. The standard cell library may be stored in a storage device and the standard cell library may be provided by accessing the storage device.

Placement and routing are performed based on the input data and the standard cell library (S300), and output data defining the integrated circuit are provided based on a result of the placement and the routing (S400).

In some example embodiments, when the received input data are data such as the bitstream or the netlist generated by synthesizing the integrated circuit, the output data may be the bitstream or the netlist. In other example embodiments, when the received input data are data defining the layout of the integrated circuit, for example, the data having a graphic data system II (GDSII) format, a format of the output data may also be data defining the layout of the integrated circuit.

Figure 18:
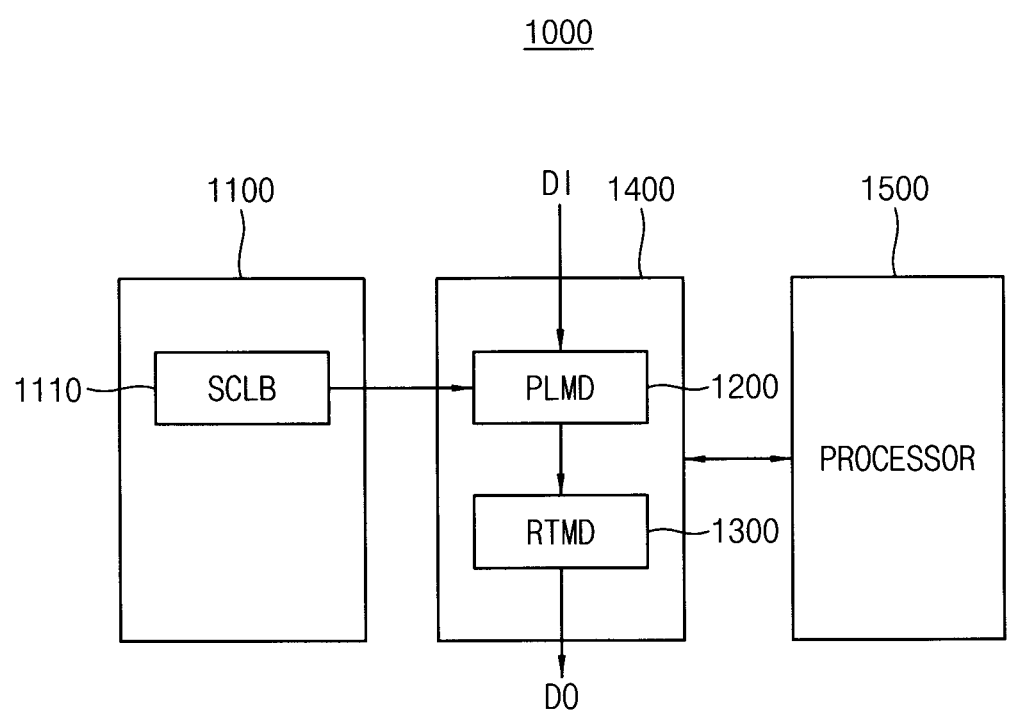
FIG. 18 is a block diagram illustrating a designing system of an integrated circuit according to example embodiments.

FIG. 18 is a block diagram illustrating a designing system of an integrated circuit according to example embodiments.

Referring to FIG. 18, a designing system 1000 may include a storage medium 1100, a designing module 1400 and a processor 1500.

The storage medium 1100 (e.g., a storage device) may store a standard cell library SCLB 1110. The standard cell library 1110 may be provided from the storage medium 1100 to the designing module 1400. The standard cell library 1110 may include a plurality of standard cells. The standard cells may include at least one multi-height standard cell according to example embodiments. The standard cell may be a small, e.g., minimum, unit for designing a block, a device and/or a chip.

The storage medium 1100 may include any computer-readable storage medium used to provide commands and/or data to a computer as a computer-readable storage medium. For example, the computer-readable storage medium 1100 may include volatile memory such as random access memory (RAM), read only memory (ROM), etc. and non-volatile memory such as flash memory, magnetoresistive RAM (MRAM), phase-change RAM (PRAM), resistive RAM (RRAM), etc. The computer-readable storage medium 1100 may be inserted into the computer, may be integrated in the computer, or may be coupled to the computer through a communication medium such as a network and/or a wireless link.

The designing module 1400 may include a placement module PLMD 1200 and a routing module RTMD 1300. Herein, the term "module" may indicate, but is not limited to, a software and/or hardware component, such as a field programmable gate array (FPGA) or an application specific integrated circuit (ASIC), which performs certain tasks. A module may reside in a tangible, addressable storage medium and may execute on one or more processors. For example, a module may include software components, class components, task components, processes, functions, attributes, procedures, subroutines, program code segments, drivers, firmware, micro codes, circuits, data, database, data structures, tables, arrays, parameters, etc. A module may be divided into a plurality of modules performing detailed functions.

The placement module 1200 may, using the processor 1500, arrange standard cells based on input data DI defining the integrated circuit and the standard cell library 1110. The routing module 1300 may perform signal routing with respect to cell placement provided from the placement module 1200. If the routing is not successful, the placement module 1200 may modify the previous cell placement and the routing module 1300 may perform the signal routing with the modified cell placement. When the routing is successfully completed, the routing module 1300 may provide output data DO defining the integrated circuit.

The placement module 1200 and the routing module 1300 may be implemented by a single integrated designing module 1400 or may be implemented by separate and different modules. The integrated designing module 1400 including the placement module 1200 and the routing module 1300 may perform the placement and the routing using the multi-height standard cells as described above.

The placement module 1200 and/or the routing module 1300 may be implemented in software, but example embodiments are not limited thereto. If the placement module 1200 and the routing module 1300 are implemented in software, they may be stored in the storage medium 1100 as program codes or in other storage mediums.

The processor 1500 may be used when the designing module 1400 performs a computation. In FIG. 18, only one processor 1500 is illustrated. Alternatively, a plurality of processors may be included in the designing system 1000. In addition, the processor 1500 may include cache memories, which increase computation capacity.

Figure 19:
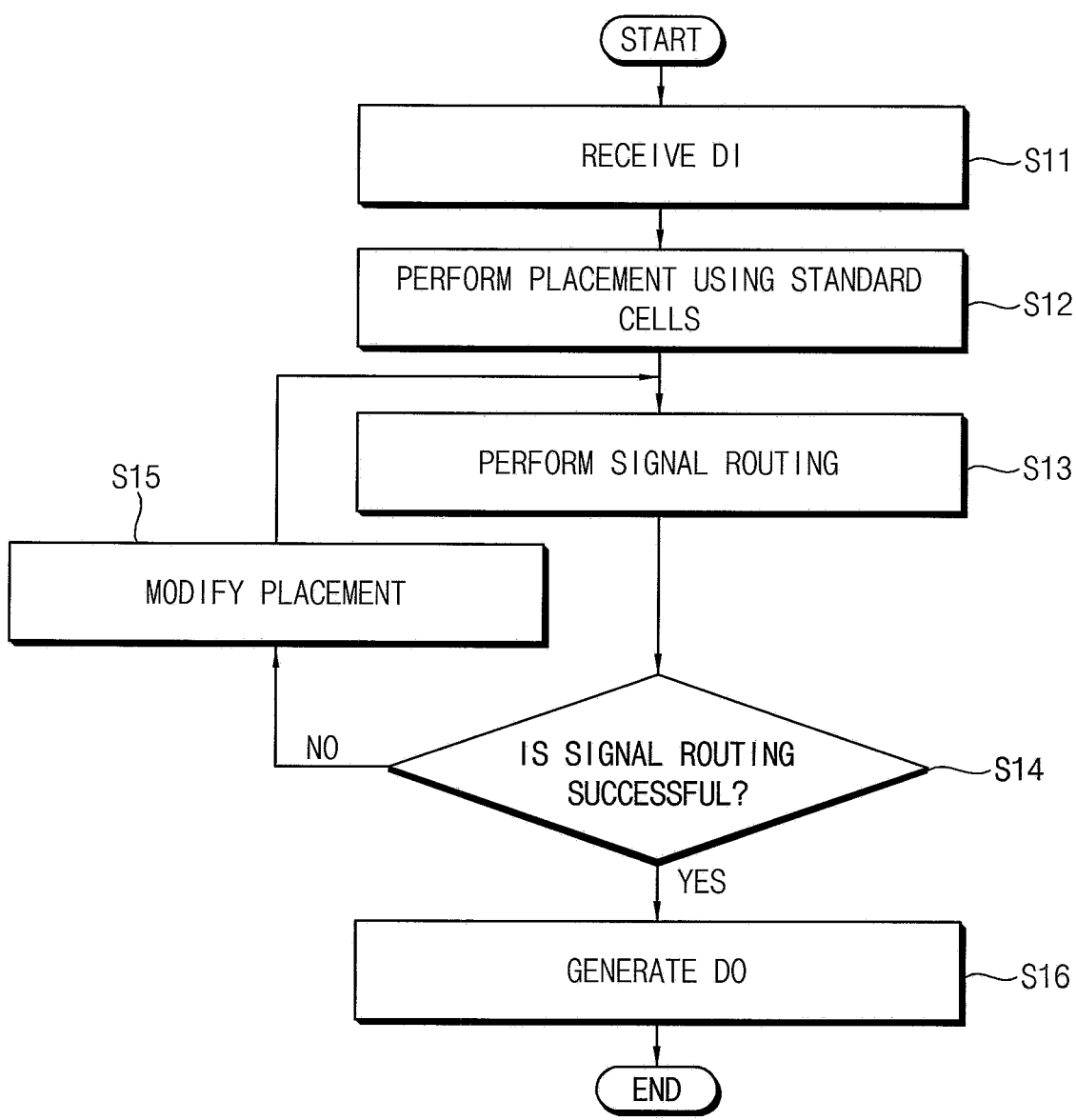
FIG. 19 is a flow chart illustrating an example operation of the designing system of FIG. 18.

FIG. 19 is a flow chart illustrating an example operation of the designing system 1000 of FIG. 18.

Referring to FIGS. 18 and 19, the designing module 1400 may receive input data DI defining the integrated circuit (S11). The placement module 1200 may refer to the standard cell library 1110 including at least one multi-height standard cell as described above so as to extract standard cells corresponding to the input data DI, and may perform cell placement using the extracted standard cells (S12). The routing module 1300 may perform signal routing with respect to the placed cells (S13).

When the signal routing is not successful (S14: NO), the placement module 1200 may replace at least one standard cell, e.g. may replace at least one standard cell with another standard cell, to modify the placement of the cells (S15). The routing module 1300 may perform the signal routing again with respect to the modified placement (S13).

As such, the replacement and the routing may be repeated until the signal routing is successfully completed. When the signal routing is successfully completed (S14: YES), the designing module 1400 may generate output data DO defining the integrated circuit (S16).

Figure 20:
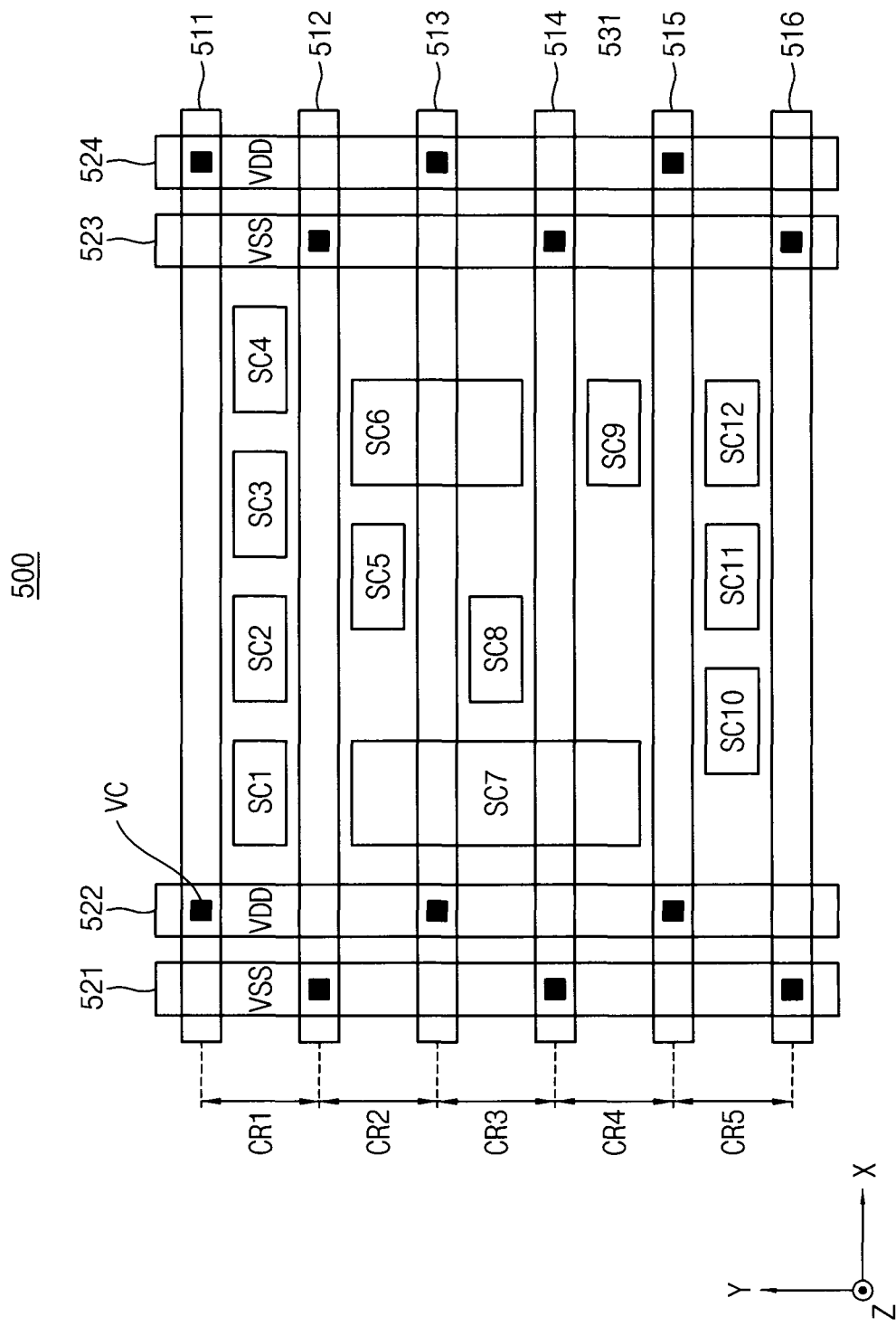
FIG. 20 is a diagram illustrating a layout of an integrated circuit according to example embodiments.

FIG. 20 is a diagram illustrating a layout of an integrated circuit according to example embodiments.

An integrated circuit 500 of FIG. 20 may be an application specific integrated circuit (ASIC). A layout of the integrated circuit 300 may be determined by performing the above-described placement and routing of standard cells SC1-SC12. Power may be provided to the standard cells SC1-SC12 through power rails 511-516. The power rails 511-516 may include high power rails 511, 513, and 515 to provide a first power supply voltage VDD, and low power rails 512, 514, and 516 to provide a second power supply voltage VSS lower than the first power supply voltage VDD. For example, the first power supply voltage VDD may be a power supply voltage having a positive voltage level, and the second power supply voltage VSS may be a ground voltage having a ground level (e.g., 0V) or a negative voltage level.

The high power rails 511, 513, and 515, and the low power rails 512, 514, and 516 extend in the first direction X and are arranged alternatively one by one in the second direction Y to form boundaries of a plurality of circuit rows CR1-CR5 corresponding to the regions defined by the power rails 511-516 arranged in the second direction Y.

According to some example embodiments, power may be distributed to the power rails 511-516 through power mesh routes 521-524 that extend in the second direction Y. Some power mesh routes 522 and 524 may provide the first power supply voltage VDD and other power mesh routes 521 and 523 may provide the second power supply voltage VSS. The power mesh routes 521-524 may be connected to the power rails 511-516 through vertical contacts VC such as via contacts.

In general, each of the circuit rows CR1-CR5 may be connected to two adjacent power rails that are at boundaries thereof so as to be powered. For example, the standard cells SC1-SC4 in the first circuit row CR1 may be connected to an adjacent and corresponding power rail pair including the high power rail 511 and the low power rail 512.

For example, as illustrated in FIG. 20, the standard cell SC6 may be a double-height standard cell formed in the two circuit rows CR2 and CR3, and the standard cell SC7 may be a triple-height standard cell formed in the three circuit rows C2, C3 and C4. As such, the area occupied by the integrated circuit 500 may be reduced and the performance of the integrated circuit 300 may be enhanced by efficient routing of the single-height standard cells SC1-SC5 and SC8-SC12 and the multi-height standard cells SC6 and SC7.

Figure 21:
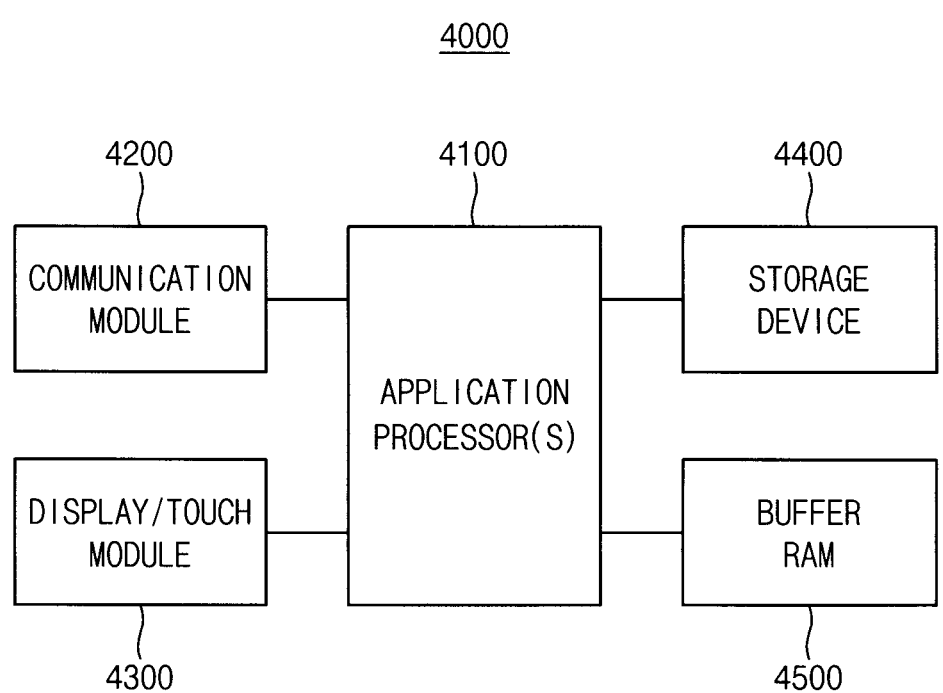
FIG. 21 is a block diagram illustrating a mobile device according to example embodiments.

FIG. 21 is a block diagram illustrating a mobile device according to example embodiments.

Referring to FIG. 21, a mobile device 4000 may include at least one application processor 4100, a communication module 4200, a display/touch module 4300, a storage device 4400, and a buffer RAM 4500.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel.

The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 4000 may include at least one multi-height standard cell according to example embodiments. As described above, a design of the multi-height standard cell may be included in the standard cell library and integrated circuits included in the mobile device 4000 may be designed through automatic placement and routing by a design tool.

As described above, the integrated circuit and the method of designing the integrated circuit according to example embodiments may reduce an occupation area of the integrated circuit and enhance performance of the integrated circuit using the multi-height standard cell having an efficient clock routing structure to reduce wirings for connecting clock nodes and an efficient arrangement of transistors according to the clock routing structure.

Embodiments may be applied to any electronic devices and systems. For example, embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. An integrated circuit comprising:
   a semiconductor substrate;
   a first power rail, a second power rail, and a third power rail formed above the semiconductor substrate, extending in a first direction and arranged sequentially in a second direction perpendicular to the first direction; and
   a first clock gate line, a second clock gate line, a third clock gate line, and a fourth clock gate line formed above the semiconductor substrate, extending in the second direction to pass through a first region between the first power rail and the second power rail, and a second region between the second power rail and the third power rail,
   wherein the first clock gate line and the second clock gate line are arranged to be adjacent to each other in the first direction, and the third clock gate line and the fourth clock gate line are arranged to be adjacent to each other in the first direction.

2. The integrated circuit of claim 1, wherein each clock gate line of the first through fourth clock gate lines connects first gate electrodes of clock transistors in the first region and second gate electrodes of clock transistors in the second region, the first gate electrodes corresponding to portions of each clock gate line and the second gate electrodes corresponding to other portions of each clock gate line.

3. The integrated circuit of claim 1, wherein each clock gate line of the first through fourth clock gate lines is not cut by a gate cut area in the first and second regions.

4. The integrated circuit of claim 1, wherein one of the first clock gate line and the second clock gate line forms a first clock node to which a clock signal is applied, the other of the first clock gate line and the second clock gate line forms a first inversion clock node to which an inverted clock signal is applied, and
wherein one of the third clock gate line and the fourth clock gate line forms a second clock node to which the clock signal is applied, and the other of the third clock gate line and the fourth clock gate line forms a second inversion clock node to which the inverted clock signal is applied.

5. The integrated circuit of claim 4, wherein the first region forms at least a first master latch, based on the first and second clock gate lines, and a first slave latch based on the third and fourth clock gate lines,
wherein the second region forms at least a second master latch, based on the first and second clock gate lines, and a second slave latch based on the third and fourth clock gate lines,
wherein the first master latch in the first region is configured to latch a first input signal in synchronization with the clock signal and the inverted clock signal to generate a first master output signal;
wherein the first slave latch in the first region is configured to latch the first master output signal in synchronization with the clock signal and the inverted clock signal to generate a first slave output signal;
wherein the second master latch in the second region is configured to latch a second input signal in synchronization with the clock signal and the inverted clock signal to generate a second master output signal, and
wherein the second slave latch in the second region is configured to latch the second master output signal in synchronization with the clock signal and the inverted clock signal to generate a second slave output signal.

6. The integrated circuit of claim 5, wherein a node generating the first master output signal is formed in the first region between the first clock gate line and the second clock gate line,
wherein a node generating the first slave output signal is formed in the first region between the third clock gate line and the fourth clock gate line,
wherein a node generating the second master output signal is formed in the second region between the first clock gate line and the second clock gate line, and
wherein a node generating the second slave output signal is formed in the second region between the third clock gate line and the fourth clock gate line.

7. The integrated circuit of claim 5, wherein the first clock gate line and the second clock gate line provide the clock signal and the inverted clock signal to first master latch and the second master latch, and
wherein the third clock gate line and the fourth clock gate line provide the clock signal and the inverted clock signal to the first slave latch and the second slave latch.

8. The integrated circuit of claim 5, wherein the first master latch comprises:
a first tri-state inverter configured to receive the first input signal and output the first master output signal in synchronization with the clock signal and the inverted clock signal; and
a second tri-state inverter configured to receive a first inverted master output signal and output the first master output signal in synchronization with the clock signal and the inverted clock signal,
wherein the first slave latch comprises:
a third tri-state inverter configured to receive the first master output signal and output the first slave output signal in synchronization with the clock signal and the inverted clock signal; and
a fourth tri-state inverter configured to receive a first inverted slave output signal and output the first slave output signal in synchronization with the clock signal and the inverted clock signal,
wherein the second master latch comprises:
a fifth tri-state inverter configured to receive the second input signal and output the second master output signal in synchronization with the clock signal and the inverted clock signal; and
a sixth tri-state inverter configured to receive a second inverted master output signal and output the second master output signal in synchronization with the clock signal and the inverted clock signal, and
wherein the second slave latch comprises:
a seventh tri-state inverter configured to receive the second master output signal and output the second slave output signal in synchronization with the clock signal and the inverted clock signal; and
an eighth tri-state inverter configured to receive a second inverted slave output signal and output the second slave output signal in synchronization with the clock signal and the inverted clock signal.

9. The integrated circuit of claim 8, wherein a first master intermediate gate line is disposed at a side of the first clock gate line and divided into a plurality of gate segments to provide the first inverted master output signal to the first master latch and provide the second inverted master output signal to the second master latch,
wherein a first master input gate line is disposed between the first clock gate line and the first master intermediate gate line and divided into a plurality of gate segments to provide the first input signal to the first master latch and provide the second input signal to the second master latch,
wherein a second master intermediate gate line is disposed at a side of the second clock gate line and divided into a plurality of gate segments to provide the first inverted master output signal to the first master latch and provide the second inverted master output signal to the second master latch, and
wherein a second master input gate line is disposed between the second clock gate line and the second master intermediate gate line and divided into a plurality of gate segments to provide the first input signal to the first master latch and provide the second input signal to the second master latch,
wherein a first slave intermediate gate line is disposed at a side of the third clock gate line and divided into a plurality of gate segments to provide the first inverted slave output signal to the first slave latch and provide the second inverted slave output signal to the second slave latch, wherein a first slave input gate line is disposed between the third clock gate line and the first slave intermediate gate line and divided into a plurality of gate segments to provide the first master output signal to the first slave latch and provide the second master output signal to the second slave latch, wherein a second slave intermediate gate line disposed at a side of the fourth clock gate line and divided into a plurality of gate segments to provide the first inverted slave output signal to the first slave latch and provide the second inverted slave output signal to the second slave latch, and wherein a second slave input gate line disposed between the fourth clock gate line and the second slave intermediate gate line and divided into a plurality of gate segments to provide the first master output signal to the first slave latch and provide the second master output signal to the second slave latch.

10. The integrated circuit of claim 9, wherein one of the first master intermediate gate line and the second master intermediate gate line forms a gate electrode of a P-type metal oxide semiconductor (PMOS) transistor, and the other of the first master intermediate gate line and the second master intermediate gate line forms a gate electrode of an N-type metal oxide semiconductor (NMOS) transistor, wherein one of the first slave intermediate gate line and the second slave intermediate gate line forms a gate electrode of a PMOS transistor, and the other of the first slave intermediate gate line and the second slave intermediate gate line forms a gate electrode of an NMOS transistor, wherein one of the first master input line and the second master intermediate gate line forms a gate electrode of a PMOS transistor, and the other of the first master input gate line and the second master input gate line forms a gate electrode of an NMOS transistor, and wherein one of the first slave input gate line and the second slave input gate line forms a gate electrode of a PMOS transistor, and the other of the first slave input gate line and the second slave input gate line forms a gate electrode of an NMOS transistor.

11. The integrated circuit of claim 9, wherein each of the first master intermediate gate line, the second master intermediate gate line, the first slave intermediate gate line, and the second slave intermediate gate line is cut at a boundary region between the first region and the second region to be divided into two gate segments.

12. The integrated circuit of claim 9, wherein each of the first master intermediate gate line, the second master intermediate gate line, the first slave intermediate gate line, and the second slave intermediate gate line is cut at the first region, at the second region and at a boundary region between the first region and the second region to be divided into four gate segments.

13. The integrated circuit of claim 12, wherein the first inverted master output signal and the second inverted master output signal, or the first inverted slave output signal and the second inverted slave output signal are applied to two gate segments of the four gate segments, and each of the other two gate segments of the four gate segments forms an electrode of a capacitor.

14. The integrated circuit of claim 9, wherein each of the first master input gate line, the second master input gate line, the first slave input gate line, and the second slave input gate line is cut at the first region, at the second region and at a boundary region between the first region and the second region to be divided into four gate segments.

15. The integrated circuit of claim 14, wherein the first input signal and the second input signal are applied to two gate segments of the four gate segments, and each of the other two gate segments of the four gate segments forms a portion of a jumper structure connecting active areas at both sides of a corresponding one of the first master input gate line, the second master input gate line, the first slave input gate line, and the second slave input gate line.

16. The integrated circuit of claim 9, wherein each of the first master input gate line, the second master input gate line, the first slave input gate line, and the second slave input gate line is divided into two gate segments, and wherein the first input signal and the second input signal are applied to the two gate segments.

17. The integrated circuit of claim 8, wherein a first master gate line is disposed at a side of the first clock gate line and divided into a plurality of gate segments to provide the first input signal and the first inverted master output signal to the first master latch and provide the second input signal and the second inverted master output signal to the second master latch, wherein a second master gate line is disposed at a side of the second clock gate line and divided into a plurality of gate segments to provide the first input signal and the first inverted master output signal to the first master latch and provide the second input signal and the second inverted master output signal to the second master latch, wherein a first slave gate line is disposed at a side of the third clock gate line and divided into a plurality of gate segments to provide the first master output signal and the first inverted slave output signal to the first slave latch and provide the second master output signal and the second inverted slave output signal to the second slave latch, and wherein a second slave gate line is disposed at a side of the fourth clock gate line and divided into a plurality of gate segments to provide the first master output signal and the first inverted slave output signal to the first slave latch and provide the second master output signal and the second inverted slave output signal to the second slave latch.

18. The integrated circuit of claim 17, wherein each of the first master gate line, the second master gate line, the first slave gate line and the second slave gate line is cut at the first region, at the second region and at a boundary region between the first region and the second region to be divided into four gate segments.

19. An integrated circuit comprising:
a semiconductor substrate;
a first power rail, a second power rail, and a third power rail formed above the semiconductor substrate, extending in a first direction and arranged sequentially in a second direction perpendicular to the first direction;
a first flip-flop formed in a first region between the first power rail and the second power rail, and comprising a first master latch and a first slave latch;
a second flip-flop formed in a second region between the second power rail and the third power rail, and comprising a second master latch and a second slave latch; and
a first clock gate line, a second clock gate line, a third clock gate line, and a fourth clock gate line formed above the semiconductor substrate, extending in the second direction to pass through the first region and the second region, wherein the first clock gate line and the second clock gate line are arranged to be adjacent to each other in the first direction, and the third clock gate line and the fourth clock gate line are arranged to be adjacent to each other in the first direction, and wherein the first clock gate line and the second clock gate line provide a clock signal and an inverted clock signal to the first master latch and the second master latch, and the third clock gate line and the fourth clock gate line provide the clock signal and the inverted clock signal to the first slave latch and the second slave latch.

20. A method of designing an integrated circuit, the method comprising:

receiving input data defining an integrated circuit;
providing, in a standard cell library, at least one multi-height standard cell;
performing placement and routing based on the input data and the standard cell library; and
generating output data defining the integrated circuit based on a result of the placement and the routing, wherein the multi-height standard cell comprises:
a semiconductor substrate;
a first power rail, a second power rail, and a third power rail formed above the semiconductor substrate, extending in a first direction and arranged sequentially in a second direction perpendicular to the first direction; and
a first clock gate line, a second clock gate line, a third clock gate line, and a fourth clock gate line formed above the semiconductor substrate, extending in the second direction to pass through a first region between the first power rail and the second power rail, and a second region between the second power rail and the third power rail, wherein the first clock gate line and the second clock gate line are arranged to be adjacent to each other in the first direction, and the third clock gate line and the fourth clock gate line are arranged to be adjacent to each other in the first direction.

* * * * *